US012795889B2

(12) United States Patent
Park et al.

(10) Patent No.: US 12,795,889 B2
(45) Date of Patent: Nov. 10, 2026

(54) INTEGRATED CIRCUIT DEVICE

(71) Applicant: SAMSUNG ELECTRONICS CO., LTD., Suwon-si (KR)

(72) Inventors: Jungmin Park, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 740 days.

(21) Appl. No.: 17/979,187

(22) Filed: Nov. 2, 2022

(65) Prior Publication Data

US 2023/0320075 A1 Oct. 5, 2023

(30) Foreign Application Priority Data

Mar. 29, 2022 (KR) ........................ 10-2022-0039178

(51) Int. Cl.
*H10B 12/00* (2023.01)
*H10D 1/68* (2025.01)

(52) U.S. Cl.
CPC ......... *H10B 12/315* (2023.02); *H10B 12/033* (2023.02); *H10D 1/696* (2025.01)

(58) Field of Classification Search
CPC .... H10B 12/03; H10B 12/033; H10B 12/315; H10D 1/041; H10D 1/696; H10D 1/716
See application file for complete search history.

(56) References Cited

U.S. PATENT DOCUMENTS

| | | | |
|---|---|---|---|
| 11,114,541 B2 | 9/2021 | Moon et al. |
| 11,532,696 B2 | 12/2022 | Cho et al. |
| 11,665,884 B2 | 5/2023 | Woo et al. |
| 2012/0127629 A1 | 5/2012 | Roeder et al. |
| 2013/0285205 A1 | 10/2013 | Chen et al. |

(Continued)

FOREIGN PATENT DOCUMENTS

| | | | |
|---|---|---|---|
| CN | 111755603 A | 10/2020 |
| CN | 113764417 A | 12/2021 |

(Continued)

OTHER PUBLICATIONS

First Office Action issued Jan. 29, 2024 by the Taiwan Intellectual Property Office for the corresponding Taiwanese Patent Application No. 112111573.

*Primary Examiner* — Molly K Reida
(74) *Attorney, Agent, or Firm* — Muir Patent Law, PLLC

(57) ABSTRACT

An integrated circuit (IC) device includes a lower electrode on a substrate. The lower electrode includes a metal-containing film including a first metal. A dielectric film covers the lower electrode. An upper electrode faces the lower electrode with the dielectric film therebetween. The lower electrode includes a main lower electrode layer including no metal dopant of a different type from the first metal. The main lower electrode layer is apart from the dielectric film. An interfacial lower electrode layer is in contact with the dielectric film and includes a first metal dopant and a second metal dopant. The first metal dopant is in a first valence state and includes a second metal, which is different from the first metal. The second metal dopant is in a second valence state, which is less than the first valence state, and includes a third metal, which is different from the first and second metals.

20 Claims, 19 Drawing Sheets

(56) References Cited

U.S. PATENT DOCUMENTS

| | | | |
|---|---|---|---|
| 2015/0270580 A1 | 9/2015 | Habuta et al. | |
| 2016/0079247 A1 | 3/2016 | Lim et al. | |
| 2020/0286985 A1* | 9/2020 | Lim | H01L 21/28247 |
| 2020/0312952 A1* | 10/2020 | Cho | H10D 1/692 |
| 2021/0159320 A1 | 5/2021 | Liao et al. | |
| 2021/0183718 A1 | 6/2021 | Lee et al. | |
| 2022/0085010 A1* | 3/2022 | Jung | H10D 1/692 |
| 2022/0093603 A1 | 3/2022 | Cho et al. | |
| 2022/0238641 A1 | 7/2022 | Park et al. | |

FOREIGN PATENT DOCUMENTS

| | | |
|---|---|---|
| KR | 10-2003-0025747 A | 3/2003 |
| KR | 1020200114865 A | 10/2020 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2022-0039178, filed on Mar. 29, 2022, in the Korean Intellectual Property Office, the disclosure of which is incorporated by reference herein in its entirety.

BACKGROUND

1. Field

Embodiments relate to an integrated circuit device (IC device).

2. Description of the Related Art

Due to the development of electronics technology, the downscaling of semiconductor devices has rapidly progressed. Accordingly, patterns included in electronic devices are being miniaturized.

SUMMARY

An embodiment is directed to an IC device including a lower electrode on a substrate. The lower electrode includes a metal-containing film including a first metal. A dielectric film covers the lower electrode. An upper electrode faces the lower electrode with the dielectric film therebetween. The lower electrode includes a main lower electrode layer including no metal dopant of a different type from the first metal. The main lower electrode layer is apart from the dielectric film. An interfacial lower electrode layer is in contact with the dielectric film and includes a first metal dopant and a second metal dopant. The first metal dopant includes a second metal and is in a first valence state. The second metal dopant includes a third metal and is in a second valence state. The second metal is different from the first metal, the third metal is different from the first metal and the second metal, and the second valence state is less than the first valence state.

An embodiment is directed to an IC device including a substrate including an active region. A conductive region is formed on the active region. A capacitor is formed on the conductive region. An insulating support pattern supports a portion of the capacitor. The capacitor includes a lower electrode, a dielectric film, and an upper electrode. The lower electrode includes a portion in contact with the insulating support pattern and a metal-containing film including a first metal. The dielectric film covers the lower electrode and the insulating support pattern. The upper electrode includes a second metal and faces the lower electrode with the dielectric film therebetween. The lower electrode includes a main lower electrode layer including no metal dopant of a different type from the first metal. The main lower electrode layer is apart from the dielectric film. An interfacial lower electrode layer is in contact with the dielectric film and includes a first metal dopant and a second metal dopant. The first metal dopant includes the second metal and is in a first valence state. The second metal dopant includes a third metal and is in a second valence state. The second metal is different from the first metal, the third metal is different from the first metal and the second metal, and the second valence state is less than the first valence state.

An embodiment is directed to an IC device including a substrate including an active region. A plurality of conductive regions are on the active region. A plurality of lower electrodes are connected to the plurality of conductive regions. Each of the lower electrodes includes a metal-containing film including a first metal. An insulating support pattern is in contact with a partial region of each of the plurality of lower electrodes to support the plurality of lower electrodes. A dielectric film covers the plurality of lower electrodes and the insulating support pattern. An upper electrode faces the plurality of lower electrodes with the dielectric film therebetween. Each of the plurality of lower electrodes includes a main lower electrode layer including no metal dopant of a different type from the first metal. The main lower electrode layer is apart from the dielectric film. An interfacial lower electrode layer is in contact with the dielectric film and includes a first metal dopant and a second metal dopant. The first metal dopant includes a second metal and is in a first valence state. The second metal dopant includes a third metal and is in a second valence state. The second metal is different from the first metal, and the third metal is different from the first metal and the second metal. The second valence state is less than the first valence state. In the interfacial lower electrode layer, a first dopant concentration of the first metal dopant is higher than a second dopant concentration of the second metal dopant.

BRIEF DESCRIPTION OF THE DRAWINGS

Features will become apparent to those of skill in the art by describing in detail example embodiments with reference to the attached drawings, in which.

DETAILED DESCRIPTION

Figure 1A:
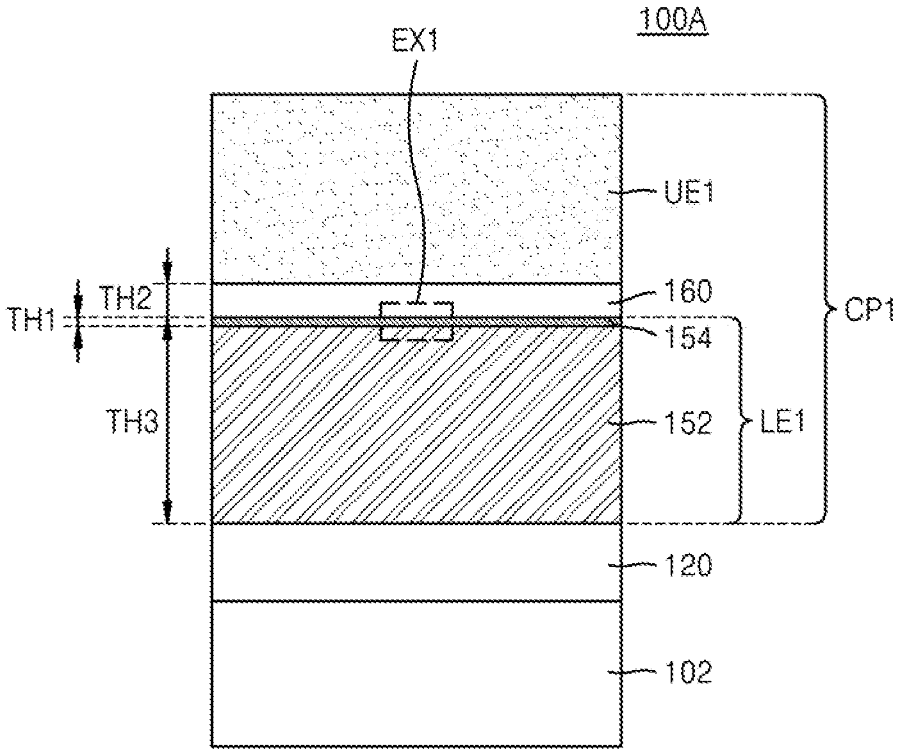
FIG. 1A is a cross-sectional view of main components of an integrated circuit (IC) device according to an example embodiment.

FIG. 1A is a cross-sectional view of main components of an integrated circuit (IC) device 100A according to an example embodiment.

Referring to FIG. 1A, the IC device 100A may include a substrate 102, a lower structure 120 formed on the substrate 102, and a capacitor CP1 formed on the lower structure 120.

The substrate 102 may include a semiconductor element material, such as silicon (Si) or germanium (Ge), or a compound semiconductor, such as silicon carbide (SiC), gallium arsenide (GaAs), indium arsenide (InAs), or indium phosphide (InP).

The substrate 102 may include a semiconductor substrate and at least one insulating film or structures including at least one conductive region, which are formed on the semiconductor substrate. The at least one conductive region may include, e.g., a doped well or a doped structure. The substrate 102 may include various device isolation structures, such as shallow trench isolation (STI) structures.

The lower structure 120 may include an insulating film. The lower structure 120 may include various conductive regions, e.g., wiring layers, contact plugs, and transistors, and may include insulating films configured to electrically insulate the conductive regions from each other.

The capacitor CP1 may include a lower electrode LE1, a dielectric film 160 covering the lower electrode LE1, and an upper electrode UE1, which covers the dielectric film 160 and is spaced apart from the lower electrode LE1 with the dielectric film 160 therebetween. The upper electrode UE1 may face the lower electrode LE1 with the dielectric film 160 therebetween.

The lower electrode LE1 may include a metal-containing film including a first metal.

The upper electrode UE1 may include the same metal as the first metal of the lower electrode LE1, or the upper electrode UE1 may include a metal that is different from the first metal of the lower electrode LE1. Each of the lower electrode LE1 and the upper electrode UE1 may include a metal film, a conductive metal oxide film, a conductive metal nitride film, a conductive metal oxynitride film, or a combination thereof. Each of the lower electrode LE1 and the upper electrode UE1 may include titanium (Ti), Ti oxide, Ti nitride, Ti oxynitride, niobium (Nb), Nb oxide, Nb nitride, Nb oxynitride, cobalt (Co), Co oxide, Co nitride, Co oxynitride, tin (Sn), Sn oxide, Sn nitride, Sn oxynitride, or a combination thereof. Each of the lower electrode LE1 and the upper electrode UE1 may include NbN, TiN, CoN, $SnO_2$, or a combination thereof. Each of the lower electrode LE1 and the upper electrode UE1 may include TaN, TiAlN, TaAlN, W, Ru, $RuO_2$, $SrRuO_3$, Ir, $IrO_2$, Pt, PtO, SRO ($SrRuO_3$), BSRO ($(Ba,Sr)RuO_3$), CRO ($CaRuO_3$), LSCO ($(La,Sr)CoO_3$), or a combination thereof.

The lower electrode LE1 may include a main lower electrode layer 152 spaced apart from the dielectric film 160, and an interfacial lower electrode layer 154 in contact with the main lower electrode layer 152 and between the main lower electrode layer 152 and the dielectric film 160.

The interfacial lower electrode layer 154 may include two types of metal dopants, both including different metal elements from that of the first metal. For example, the main lower electrode layer 152 may be formed of the first metal, and the interfacial lower electrode layer 154 may be formed of the first metal that is doped with two metal dopants that are each different from each other and different from the first metal. The main lower electrode layer 152 may not include a metal dopant of a different type from that of the first metal.

The doping will now be further described with reference to FIG. 1B, after which additional description of FIG. 1A will be provided.

Figure 1B:
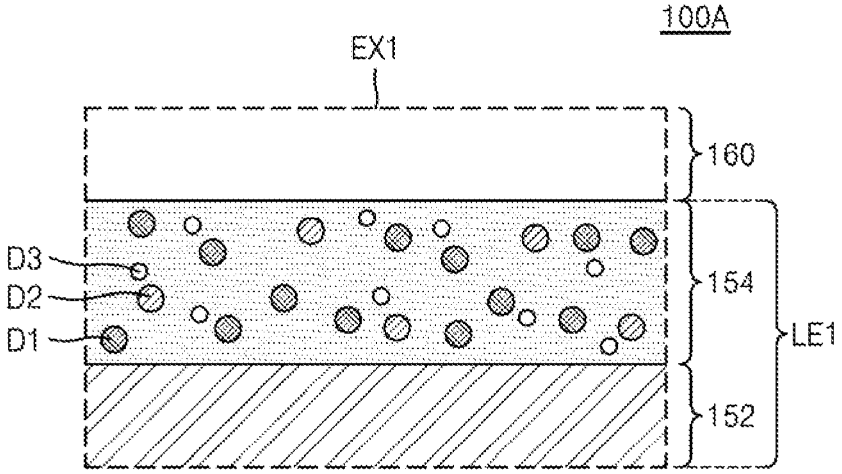
FIG. 1B is an enlarged cross-sectional view of region “EX1” of FIG. 1A, according to an example embodiment.

FIG. 1B is an enlarged cross-sectional view of region "EX1" of FIG. 1A, according to an example embodiment. FIG. 1B illustrates a configuration of the interfacial lower electrode layer 154, including a first metal dopant D1, a second metal dopant D2, and oxygen atoms D3.

In an example embodiment, the interfacial lower electrode layer 154 may include the first metal dopant D1 and the second metal dopant D2, in addition to the first metal.

The first metal dopant D1 may include a second metal, which is different from the first metal, i.e., the second metal included in the first metal dopant D1 may be a metal element that is different from the first metal included in a main lower electrode layer 152. The second metal may be in a first valence state.

The second metal dopant D2 may include a third metal, which is different from the first metal and the second metal, i.e., the third metal included in the second metal dopant D2 may be a metal element that is different from the first metal included in the main lower electrode layer 152 and different from the second metal included in the first metal dopant D1. The third metal may be in a second valence state.

The second valence state of the third metal may be less than, e.g., numerically lower than, the first valance state of the second metal. For example, in an example embodiment, the second metal may have a valence state of +5, and the third metal may have a valence state of +3. For example, the second metal included in the first metal dopant D1 may include vanadium (V), tantalum (Ta), niobium (Nb), or molybdenum (Mo), and the third metal included in the second metal dopant D2 may include aluminum (Al), lanthanum (La), yttrium (Y), vanadium (V), chromium (Cr), niobium (Nb), or tantalum (Ta).

The vanadium (V), tantalum (Ta), niobium (Nb), or molybdenum (Mo) as the second metal may be diffused into the interfacial lower electrode layer 154 from a $V_2O_5$ film, a $Ta_2O_5$ film, a $Nb_2O_5$ film, or a $Mo_2O_5$ film, respectively, that formed is adjacent to the interfacial lower electrode layer 154, as described in additional detail below in connection with FIGS. 9A to 9F.

The aluminum (Al), lanthanum (La), yttrium (Y), vanadium (V), chromium (Cr), niobium (Nb), or tantalum (Ta) as the third metal may be diffused into the interfacial lower electrode layer 154 from an $Al_2O_3$ film, a $La_2O_3$ film, a $Y_2O_3$ film, a $V_2O_3$ film, a $Cr_2O_3$ film, a $Nb_2O_3$ film, or a $Ta_2O_3$ film that is adjacent to the interfacial lower electrode layer 154, as described in additional detail below in connection with FIGS. 9A to 9F.

The interfacial lower electrode layer 154 may include or may be present as a single layer, in which the first metal dopant D1 and the second metal dopant D2 are non-uniformly mixed.

In the interfacial lower electrode layer 154, a first concentration of the first metal dopant D1 may be greater than a second concentration of the second metal dopant D2. For example, in the interfacial lower electrode layer 154, the first concentration of the first metal dopant D1 may be in a range of more than 0 atomic percent (at %) and equal to or less than about 10 at %, and the second concentration of the second metal dopant D2 may be less than the first concentration and in a range of more than 0 at % and equal to or less than about 5 at %.

The interfacial lower electrode layer 154 may further include oxygen atoms D3. For example, when the lower electrode LE1 includes a metal nitride film, such as a titanium nitride (TiN) film, the interfacial lower electrode layer 154 may include the first metal dopant D1, the second metal dopant D2, and oxygen atoms D3, which are doped into the metal nitride film.

Referring again to FIG. 1A, a thickness TH1 of the interfacial lower electrode layer 154 may be less than a thickness TH2 of the dielectric film 160 and less than a thickness TH3 of the main lower electrode layer 152. The thickness TH1 of the interfacial lower electrode layer 154 may be in a range of about 5 Å to about 20 Å, and the thickness TH2 of the dielectric film 160 may be in a range of about 20 Å to about 80 Å. The thickness TH3 of the main lower electrode layer 152 may be greater than the thickness TH2 of the dielectric film 160.

The dielectric film 160 may include a high-k dielectric film. As used herein, the term "high-k dielectric film" refers to a dielectric film having a greater dielectric constant than a silicon oxide film. The dielectric film 160 may include a metal oxide including at least one metal selected from hafnium (Hf), zirconium (Zr), aluminum (Al), niobium (Nb), cerium (Ce), lanthanum (La), tantalum (Ta), and titanium (Ti).

The high-k dielectric film may include $HfO_2$, $ZrO_2$, $Al_2O_3$, $La_2O_3$, $Ta_2O_3$, $Nb_2O_5$, $CeO_2$, $TiO_2$, $GeO_2$, or a combination thereof. The dielectric film 160 may include at least one of a ferroelectric material film, an anti-ferroelectric material film, and a paraelectric material film, e.g., the dielectric film 160 may include $HfZrO_2$, $ZrO_2$, $PbTiO_3$, $AgNbO_3$, $HfO_2$, $ZrO_2$, $TiO_2$, $Ta_2O_3$, $VO_2$, $AlO_2$, $SiO_2$, $SrTiO_3$ $BaTiO_3$, $BiFeO_3$, or a combination thereof.

The dielectric film 160 may have a single layer structure including one high-k dielectric film, or the dielectric film 160 may have a multilayered structure including a plurality of high-k dielectric films. The dielectric film 160 may include a multilayered film, in which a plurality of material films including different materials are stacked. Of the multilayered film included in the dielectric film 160, an inner dielectric film that is closest to the interfacial lower electrode layer 154 may include a ferroelectric material film or an anti-ferroelectric material film. The inner dielectric film of the dielectric film 160 may be in contact with the interfacial lower electrode layer 154 of the lower electrode LE1.

In the IC device 100A described with reference to FIGS. 1A and 1B, the interfacial lower electrode layer 154 of the lower electrode LE1, which is in contact with the dielectric film 160, may have a co-doping structure including the first metal dopant D1 and the second metal dopant D2 having different valences. The first metal dopant D1 and the second metal dopant D2, which are in the interfacial lower electrode layer 154, may provide different functions, and thus, the interfacial lower electrode layer 154 may serve as a multifunctional layer.

More specifically, the first metal dopant D1 having a relatively greater concentration (than the second metal dopant D2) may have a valence state of +5, and may prevent a depletion region from occurring in the lower electrode LE1, and a leakage current may be reduced in the capacitor CP1. Furthermore, the first metal dopant D1 may have a valence state of +5, and the second metal dopant D2 may have a valence state of +3, and thus, spontaneous polarization may occur in the dielectric film 160 due to the interfacial lower electrode layer 154. Accordingly, the dielectric film 160 may ensure a high field tunability, the capacitor CP1 may obtain a desired capacitance, and the reliability of the IC device 100A may be improved.

Figure 2:
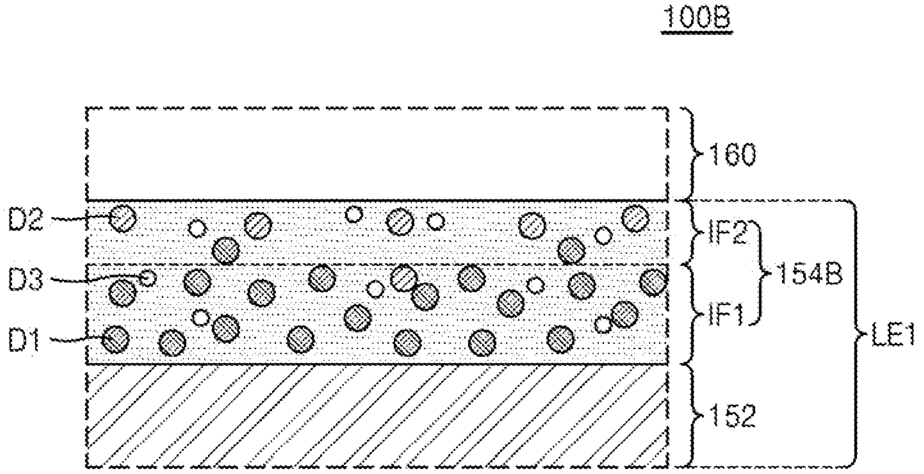
FIG. 2 is a cross-sectional view of main components of an IC device according to an example embodiment.

FIG. 2 is a cross-sectional view of main components of an IC device 100B according to an example embodiment. FIG. 2 illustrates an enlarged sectional configuration of a region corresponding to region "EX1" of FIG. 1A.

In FIG. 2, the same reference numerals are used to denote the same elements as in FIGS. 1A and 1B, and repeated descriptions thereof will be omitted.

Referring to FIG. 2, the IC device 100B may have substantially the same configuration as the IC device 100A described with reference to FIGS. 1A and 1B, except that the IC device 100B includes an interfacial lower electrode layer 154B that includes a first interfacial region IF1 and a second interfacial region IF2. The first interfacial region IF1 may be interposed between the second interfacial region IF2 and the main lower electrode layer 152. The first interfacial region IF1 may be spaced apart from the dielectric film 160 with the second interfacial region IF2 therebetween, and the second interfacial region IF2 may be in contact with the dielectric film 160.

In the first interfacial region IF1, the first metal dopant D1 may be at a greater concentration than the second metal dopant D2.

In the second interfacial region IF2, the second metal dopant D2 may be at a greater concentration than the first metal dopant D1.

In the interfacial lower electrode layer 154B as a whole, a first concentration of the first metal dopant D1 may be greater than a second concentration of the second metal dopant D2. For example, in the interfacial lower electrode layer 154B, the first concentration of the first metal dopant D1 may be in a range of more than 0 at % and equal to or less than 10 at %, and the second concentration of the second metal dopant D2 may be lower than the first concentration and in a range of more than 0 at % and equal to or more than about 5 at %.

The interfacial lower electrode layer 154B of the IC device 100B may further include oxygen atoms D3. Detailed descriptions of the first metal dopant D1 and the second metal dopant D2 may be the same as those provided above with reference to FIG. 1B.

In the IC device 100B described with reference to FIG. 2, the interfacial lower electrode layer 154B of the lower electrode LE1, which is adjacent to the dielectric film 160, may have a co-doping structure including the first metal dopant D1 and the second metal dopant D2 having different valences. In the interfacial lower electrode layer 154B, the first metal dopant D1 included in the first interfacial region IF1 and the second metal dopant D2 included in the second interfacial region IF2 may provide different functions, and thus, the interfacial lower electrode layer 154B may serve as a multifunctional layer.

More specifically, the first metal dopant D1 included in the interfacial lower electrode layer 154B may have a valence state of +5. Accordingly, the first metal dopant D1 may prevent a depletion region from occurring in the lower electrode LE1, and a leakage current may be reduced in the capacitor CP1. Furthermore, in the interfacial lower electrode layer 154B, the first metal dopant D1 included in the first interfacial region IF1 may have a valence state of +5, and the second metal dopant D2 included in the second interfacial region IF2 may have a valence state of +3. Thus, spontaneous polarization may occur in the dielectric film 160 due to the interfacial lower electrode layer 154B. Accordingly, the dielectric film 160 may ensure a high field tunability, the capacitor CP1 may obtain a desired capacitance, and the reliability of the IC device 100B may be improved.

Figure 3A:
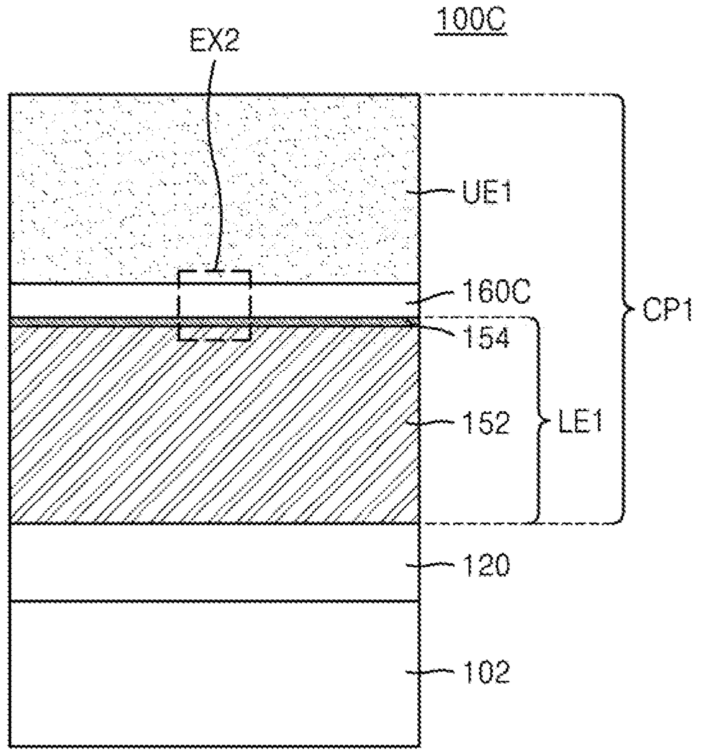
FIG. 3A is a cross-sectional view of main components of an IC device according to an example embodiment.
Figure 3B:
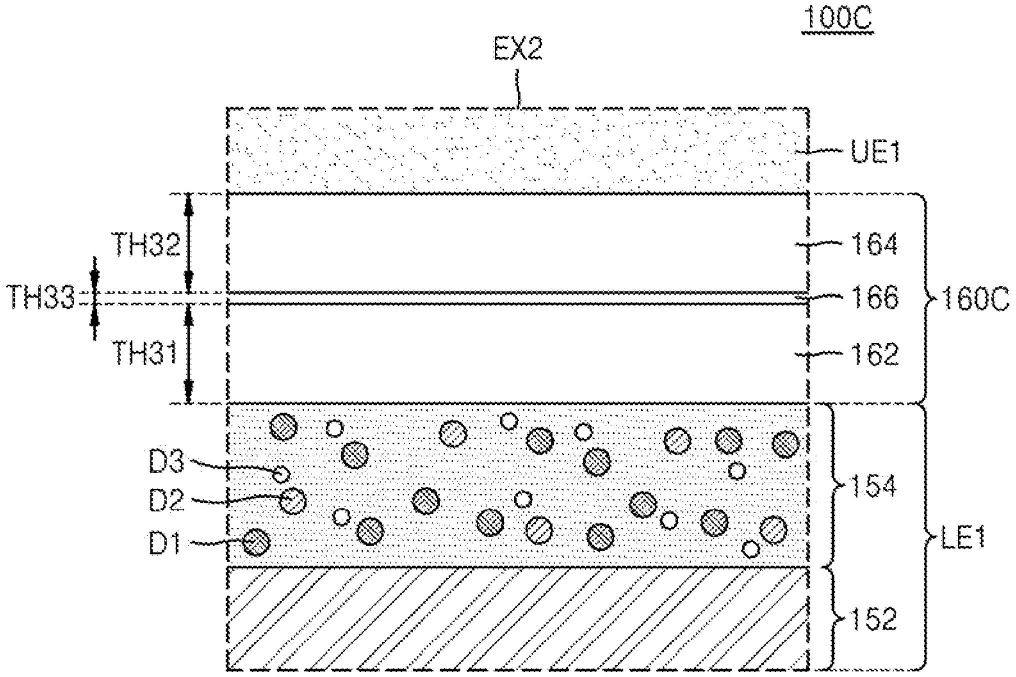
FIG. 3B is an enlarged cross-sectional view of region “EX2” of FIG. 3A, according to an example embodiment.

FIG. 3A is a cross-sectional view of main components of an IC device 100C according to an example embodiment. FIG. 3B is an enlarged cross-sectional view of region "EX2" of FIG. 3A.

In FIGS. 3A and 3B, the same reference numerals are used to denote the same elements as in FIGS. 1A and 1B, and repeated descriptions thereof will be omitted.

Referring to FIGS. 3A and 3B, the IC device 100C may have substantially the same configuration as the IC device 100A described with reference to FIGS. 1A and 1B, except that the IC device 100C may include a dielectric film 160C instead of the dielectric film 160.

The dielectric film 160C may include a first dielectric film 162 in contact with an interfacial lower electrode layer 154, a second dielectric film 164 in contact with an upper electrode UE1, and an inserted dielectric film 166 between the first dielectric film 162 and the second dielectric film 164.

The first dielectric film 162 may include a ferroelectric material film, an anti-ferroelectric material film, or a combination thereof. The first dielectric film 162 may include a single layer, in which a ferroelectric material and an anti-ferroelectric material are non-uniformly mixed. The first dielectric film 162 may include a single film including a ferroelectric material. The first dielectric film 162 may include a single film including an anti-ferroelectric material.

The second dielectric film 164 may include a paraelectric material film.

The inserted dielectric film 166 may include a material having a greater bandgap energy than a bandgap of each of the first dielectric film 162 and the second dielectric film 164, e.g., the inserted dielectric film 166 may have a bandgap energy of at least 5 eV. Because the inserted dielectric film 166 has a relatively high bandgap energy in the dielectric film 160C, a leakage current generated by the dielectric film 160C may be reduced.

The first dielectric film 162 may include $HfZrO_2$, $ZrO_2$, $PbTiO_3$, $AgNbO_3$, or a combination thereof.

The second dielectric film 164 may include $HfO_2$, $ZrO_2$, $TiO_2$, $Ta_2O_3$, $VO_2$, $AlO_2$, $SiO_2$, $SrTiO_3$ $BaTiO_3$, $BiFeO_3$, or a combination thereof.

The inserted dielectric film 166 may include $Al_2O_3$, $SiO_2$, $BeO_2$, $MoO_2$, or a combination thereof.

In a direction along a shortest distance between the interfacial lower electrode layer 154 and the upper electrode UE1, each of a thickness TH31 of the first dielectric film 162 and a thickness TH32 of the second dielectric film 164 may be greater than a thickness TH33 of the inserted dielectric film 166. The thickness TH31 of the first dielectric film 162 may be equal to or different from the thickness TH32 of the second dielectric film 164. Each of the thickness TH31 of the first dielectric film 162 and the thickness TH32 of the second dielectric film 164 may be in a range of about 30 Å to about 60 Å. The thickness TH33 of the inserted dielectric film 166 may be greater than 0 Å and about 5 Å or less.

FIG. 3B illustrates an example in which the interfacial lower electrode layer 154 included in the lower electrode LE1 of the IC device 100C has the same structure as that described with reference to FIG. 1B, but the lower electrode LE1 of the IC device 100C may include the interfacial lower electrode layer 154B described with reference to FIG. 2, instead of the interfacial lower electrode layer 154.

Figure 4:
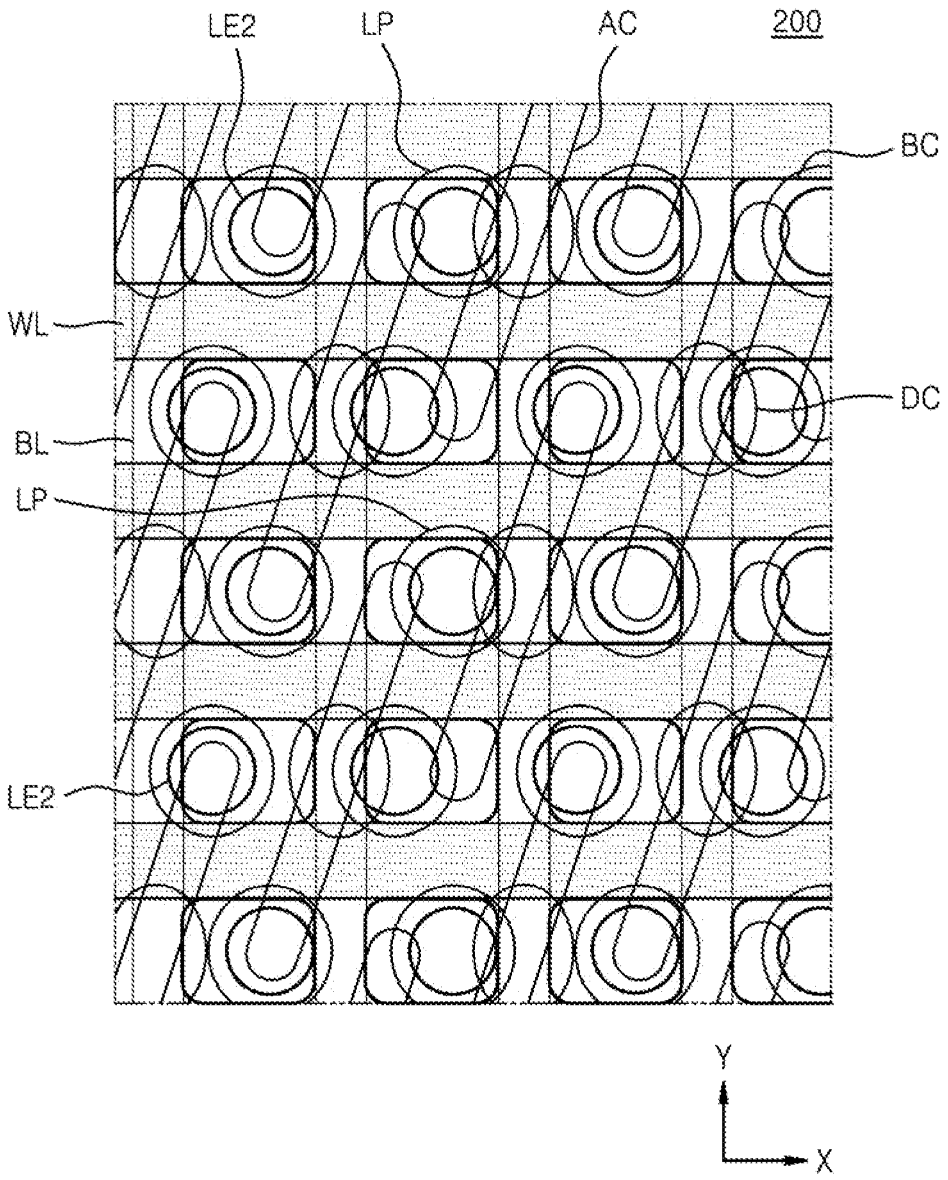
FIG. 4 illustrates a plan layout of some components of a memory cell array region of an IC device according to an example embodiment.

FIG. 4 illustrates a plan layout of some components of a memory cell array region of an IC device 200 according to an example embodiment.

Referring to FIG. 4, the IC device 200 may include a plurality of active regions AC, which laterally extend in a diagonal direction with respect to a first lateral direction (X direction) and a second lateral direction (Y direction) in a view from above.

A plurality of word lines WL may intersect with the plurality of active regions AC and may extend parallel to each other in the first lateral direction (X direction).

On the plurality of word lines WL, a plurality of bit lines BL may extend parallel to each other in the second lateral direction (Y direction), which intersects with the first lateral direction (X direction). Each of the plurality of bit lines BL may be connected to the active region AC through a direct contact DC.

A plurality of buried contacts BC may be between two adjacent ones of the plurality of bit lines BL.

A plurality of conductive landing pads LP may be respectively on the plurality of buried contacts BC. Each of the plurality of conductive landing pads LP may overlap at least a portion of a buried contact BC.

A plurality of lower electrodes LE2 may be apart from each other on the plurality of conductive landing pads LP. The plurality of lower electrodes LE2 may pass through the plurality of buried contacts BC and the plurality of conductive landing pads LP and be connected to the plurality of active regions AC.

Figure 5A:
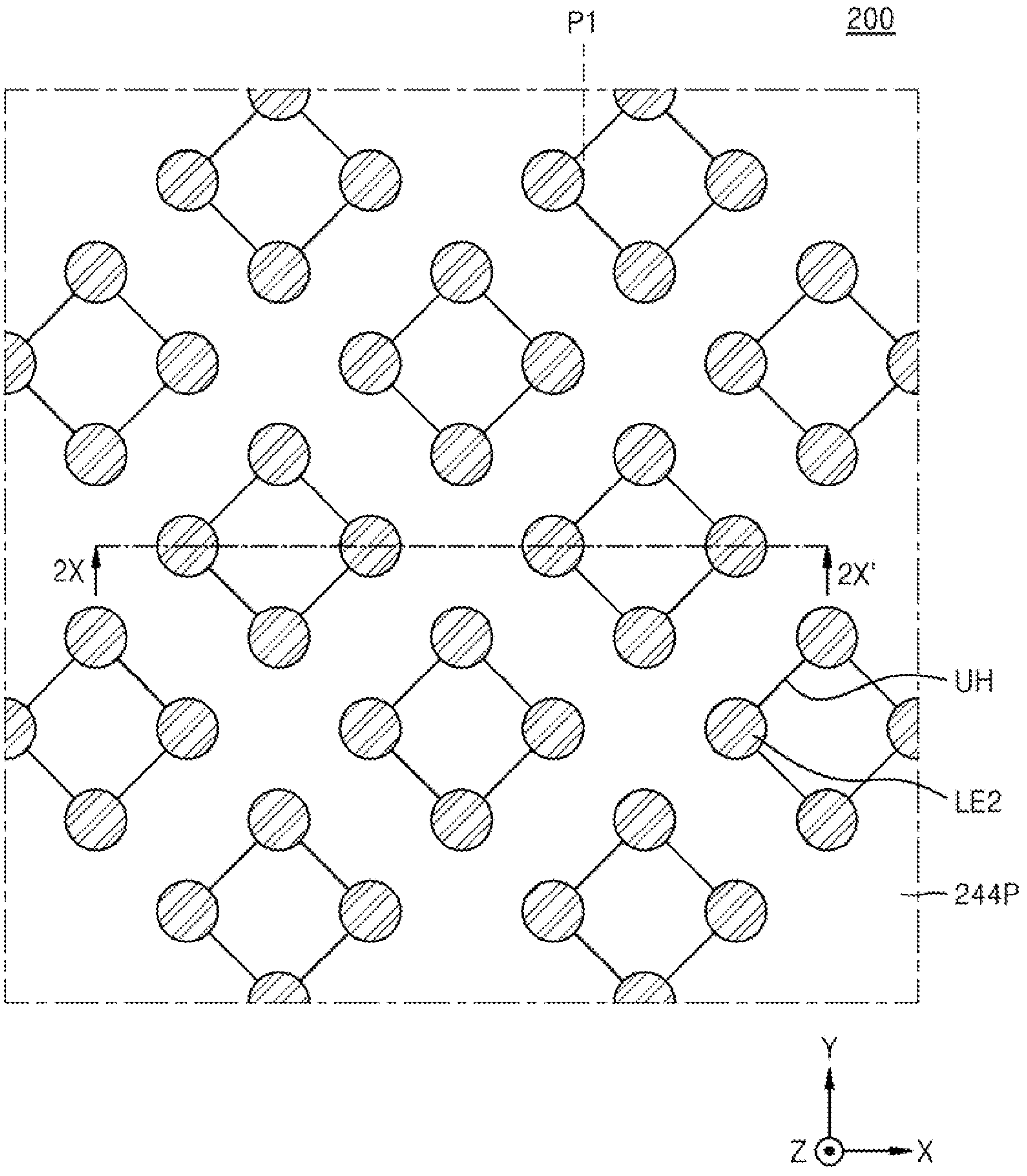
FIG. 5A is a plan view of some components of the IC device shown in FIG. 4.
Figure 5B:
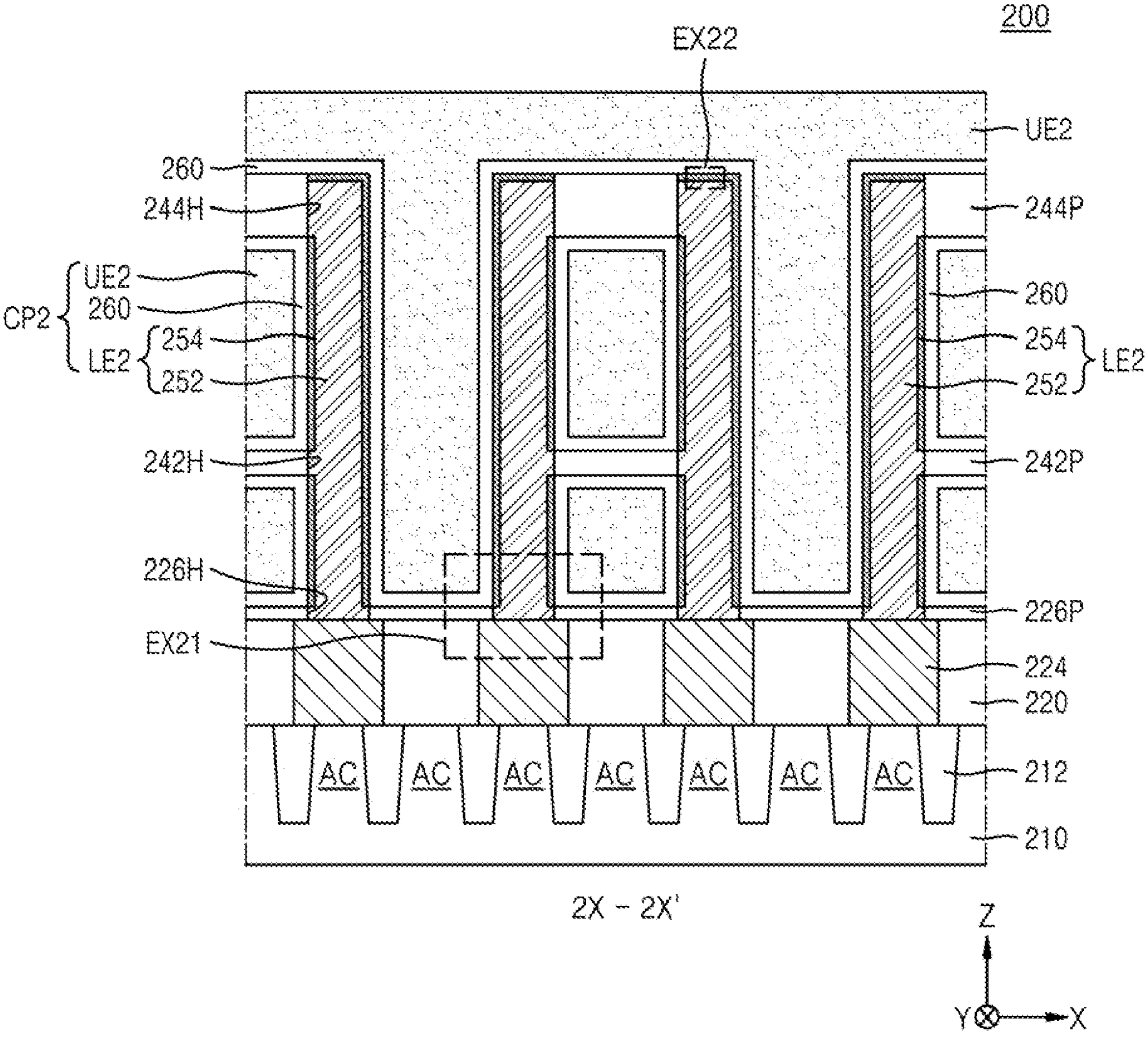
FIG. 5B is a cross-sectional view of some components, which is taken along line 2X-2X' of FIG. 5A.
Figure 5C:
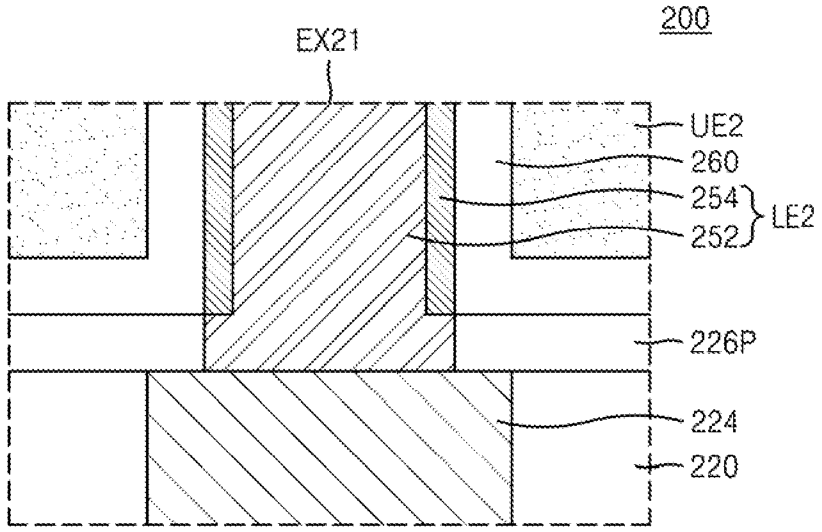
FIG. 5C is an enlarged cross-sectional view of region “EX21” of FIG. 5B.

FIG. 5A is a plan view of some components of the IC device 200 shown in FIG. 4. FIG. 5B is a cross-sectional view of some components, which is taken along line 2X-2X' of FIG. 5A. FIG. 5C is an enlarged cross-sectional view of region "EX21" of FIG. 5B.

Referring to FIGS. 5A to 5C, the IC device 200 may include a substrate 210 including a plurality of active regions AC and a lower structure 220 formed on the substrate 210. A plurality of conductive regions 224 may pass through the lower structure 220 and be respectively connected to a plurality of active regions AC.

The substrate 210 may include a semiconductor element (e.g., Si and Ge) or a compound semiconductor (e.g., SiC, GaAs, InAs, and InP).

The substrate 210 may include a semiconductor substrate and at least one insulating film or structures including at least one conductive region, which are formed on the semiconductor substrate. The conductive region may include, e.g., a doped well or a doped structure.

A device isolation film 212 defining the plurality of active regions AC may be formed in the substrate 210.

The device isolation film 212 may include an oxide film, a nitride film, or a combination thereof.

The lower structure 220 may include an insulating film, which includes a silicon oxide film, a silicon nitride film, or a combination thereof. The lower structure 220 may include various conductive regions, e.g., a wiring layer, a contact plug, a transistor, etc., and may include an insulating film configured to insulate the wiring layer, the contact plug, and the transistor from each other.

The plurality of conductive regions 224 may include polysilicon, a metal, a conductive metal nitride, a metal silicide, or a combination thereof.

The lower structure 220 may include the plurality of bit lines BL described with reference to FIG. 4.

Each of the plurality of conductive regions 224 may include the buried contact BC and the conductive landing pad LP, which have been described with reference to FIG. 4.

An insulating pattern 226P having a plurality of openings 226H may be on the lower structure 220 and the plurality of conductive regions 224 and overlap the plurality of conductive regions 224 in a vertical direction (Z direction).

The insulating pattern 226P may include a silicon nitride (SiN) film, a silicon carbonitride (SiCN) film, a silicon boron nitride (SiBN) film, or a combination thereof. As used herein, each of the terms "SiN," "SiCN," and "SiBN" refers to a material including elements included therein, without referring to a chemical formula representing a stoichiometric relationship.

A plurality of capacitors CP2 may be respectively on the plurality of conductive regions 224. Each of the plurality of capacitors CP2 may include a lower electrode LE2, a dielectric film 260 covering the lower electrode LE2, and an upper electrode UE2, which covers the dielectric film 260 and is spaced apart from the lower electrode LE2 with the dielectric film 260 therebetween.

The lower electrode LE2 may include a main lower electrode layer 252 spaced apart from the dielectric film 260, and an interfacial lower electrode layer 254 in contact with the dielectric film 260.

The lower electrode LE2 may include a metal-containing film including a first metal.

The main lower electrode layer 252 may not include a metal dopant of a different type from that of the first metal.

The interfacial lower electrode layer 254 may include two types of metal dopants including different metal elements from that of the first metal.

Constituent materials of the main lower electrode layer 252 and the interfacial lower electrode layer 254, which are in the lower electrode LE2, the dielectric film 260, and the upper electrode UE2 may be respectively substantially the same as those of the main lower electrode layer 152 and the interfacial lower electrode layer 154, which are in the lower electrode LE1, the dielectric film 160, and the upper electrode UE1, which have been described with reference to FIGS. 1A and 1B.

The insulating pattern 226P may be adjacent to a lower end of each of a plurality of lower electrodes LE2.

Each of the plurality of lower electrodes LE2 may have a pillar shape, which extends long from a top surface of the conductive region 224 through the opening 226H of the insulating pattern 226P in a direction away from the substrate 210 in the vertical direction (Z direction).

FIG. 5B illustrates an example in which each of the plurality of lower electrodes LE2 has a pillar shape, but each of the plurality of lower electrodes LE2 may have a cup-shaped sectional structure or a cylindrical sectional structure with a blocked bottom portion.

The plurality of lower electrodes LE2 may be supported by a lower insulating support pattern 242P and an upper insulating support pattern 244P. The plurality of lower electrodes LE2 may face the upper electrode UE2 with the dielectric film 260 therebetween.

The interfacial lower electrode layer 254 of the lower electrode LE2 may be formed only on a portion of the lower electrode LE2, which faces the dielectric film 160. Of the lower electrode LE2, a portion facing the insulating pattern 226P, a portion facing the lower insulating support pattern 242P, and a portion facing the upper insulating support pattern 244P may not include the interfacial lower electrode layer 254.

The dielectric film 260 may cover the lower electrode LE2, the lower insulating support pattern 242P, and the upper insulating support pattern 244P. The dielectric film 260 may include portions in contact with the interfacial lower electrode layer 254 of the lower electrode LE2, portions in contact with the insulating pattern 226P, portions in contact with the lower insulating support pattern 242P, and portions in contact with the upper insulating support pattern 244P. Portions of the dielectric film 260, which are in contact with the lower electrode LE2, may be spaced apart from the main lower electrode layer 252 with the interfacial lower electrode layer 254 therebetween.

Referring to FIG. 5B, the upper insulating support pattern 244P may extend in a lateral direction (or a direction along an X-Y plane in FIG. 5B), which is parallel to the substrate 210, while surrounding an upper end of each of the plurality of lower electrodes LE2.

A plurality of holes 244H through which the plurality of lower electrodes LE2 pass may be formed in the upper insulating support pattern 244P. An inner sidewall of each of the plurality of holes 244H formed in the upper insulating support pattern 244P may be in contact with an outer sidewall of the lower electrode LE2.

A top surface of each of the plurality of lower electrodes LE2 may be coplanar with a top surface of the upper insulating support pattern 244P.

The lower insulating support pattern 242P may extend in the lateral direction (or the direction long on the X-Y plane in FIG. 5B), which is parallel to the substrate 210, and be in contact with the outer sidewalls of the plurality of lower electrodes LE2 between the substrate 210 and the upper insulating support pattern 244P.

A plurality of holes 242H, through which the plurality of lower electrodes LE2 pass, and a plurality of lower holes (refer to LH in FIG. 9E) may be formed in the lower insulating support pattern 242P. The plurality of lower electrodes LE2 may pass through the plurality of holes 244H formed in the upper insulating support pattern 244P and the plurality of holes 242H formed in the lower insulating support pattern 242P and extend in a vertical direction (Z direction).

FIG. 5A illustrates a planar structure of each of the upper insulating support pattern 244P and the plurality of lower electrodes LE2.

Referring to FIG. 5A, a plurality of upper holes UH may be formed in the upper insulating support pattern 244P. FIG. 5A illustrates an example configuration in which each of the plurality of upper holes UH substantially has a rhombus planar shape of which vertices are respectively formed by four adjacent lower electrodes LE2.

The plurality of lower electrodes LE2 may include portions protruding to a first point P1 toward the center of the upper hole UH.

A plurality of lower holes (refer to LH in FIG. 9E) having a planar shape corresponding to the planar shape of the plurality of upper holes UH may be formed in the lower insulating support pattern 242P.

Each of the lower insulating support pattern 242P and the upper insulating support pattern 244P may include a silicon nitride (SiN) film, a silicon carbonitride (SiCN) film, a silicon boron nitride (SiBN) film, or a combination thereof. The lower insulating support pattern 242P may include the same material as the upper insulating support pattern 244P. The lower insulating support pattern 242P may include a different material from the upper insulating support pattern 244P. Each of the lower insulating support pattern 242P and the upper insulating support pattern 244P may include SiCN. The lower insulating support pattern 242P may include SiCN, and the upper insulating support pattern 244P may include SiBN.

Figure 6:
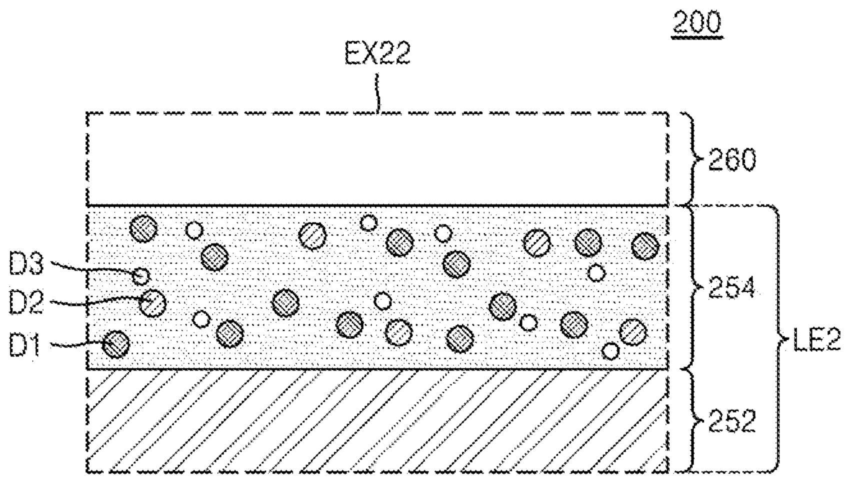
FIG. 6 is a cross-sectional view of an example structure of a lower electrode shown in FIGS. 5A and 5B, which is an enlarged cross-sectional view of region “EX22” of FIG. 5B.

FIG. 6 is a cross-sectional view of an example structure of the lower electrode LE2 shown in FIGS. 5A and 5B. FIG. 6 illustrates an enlarged sectional configuration of region "EX22" of FIG. 5B.

Referring to FIG. 6, the interfacial lower electrode layer 254 of the lower electrode LE2 shown in FIGS. 5A and 5B may include a single layer or may be a single layer, in which a first metal dopant D1 and a second metal dopant D2 are non-uniformly mixed.

The interfacial lower electrode layer 254 may include the first metal dopant D1 and the second metal dopant D2.

The first metal dopant D1 may include a second metal different from a first metal included in the lower electrode LE2 and be in a first valence state.

The second metal dopant D2 may include a third metal different from the first metal and the second metal and be in a second valence state. The second valence state may be less than, e.g., numerically lower than, the first valence state.

In the interfacial lower electrode layer 254, the first metal dopant D1 may include a metal having a valence state of +5, and the second metal dopant D2 may include a metal having a valence state of +3.

In the interfacial lower electrode layer 254, a first concentration of the first metal dopant D1 may be greater than a second concentration of the second metal dopant D2, e.g., in the interfacial lower electrode layer 254, the first concentration of the first metal dopant D1 may be in a range of more than 0 at % and equal to or less than about 10 at %, and the second concentration of the second metal dopant D2 may be lower than the first concentration and in a range of more than 0 at % and equal to or more than about 5 at %.

The interfacial lower electrode layer 254 may further include oxygen atoms D3. For example, when the lower electrode LE2 includes a metal nitride film (e.g., TiN), the interfacial lower electrode layer 254 may include the first metal dopant D1, the second metal dopant D2, and the oxygen atoms D3, which are doped into the metal nitride film.

Detailed descriptions of the first metal dopant D1 and the second metal dopant D2 may be the same as those provided above with reference to FIG. 1B.

Figure 7:
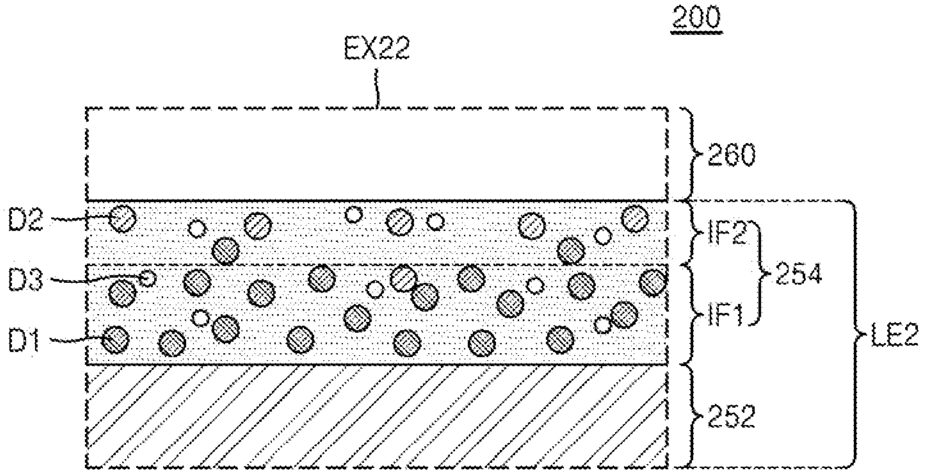
FIG. 7 is a cross-sectional view of an example structure of a lower electrode shown in FIGS. 5A and 5B, which is an enlarged cross-sectional view of region “EX22” of FIG. 5B.

FIG. 7 is a cross-sectional view of another example structure of the lower electrode LE2 shown in FIGS. 5A and 5B. FIG. 7 illustrates an enlarged sectional configuration of region "EX22" of FIG. 5B.

Referring to FIG. 7, the interfacial lower electrode layer 254 of the lower electrode LE2 shown in FIGS. 5A and 5B may include a double layer including a first interfacial region IF1, in which the first metal dopant D1 is at a greater concentration than the second metal dopant D2, and a second interfacial region IF2, in which the second metal dopant D2 is at a greater concentration than the first metal dopant D1.

In the interfacial lower electrode layer 254, a first concentration of the first metal dopant D1 may be greater than a second concentration of the second metal dopant D2. For example, in the interfacial lower electrode layer 254, the first concentration of the first metal dopant D1 may be in a range of more than 0 at % and equal to or less than about 10 at %, and the second concentration of the second metal dopant D2 may be lower than the first concentration and in a range of more than 0 at % and equal to or less than about 5 at %.

The interfacial lower electrode layer 254 may further include oxygen atoms D3.

Detailed descriptions of the first metal dopant D1 and the second metal dopant D2 may be the same as those provided above with reference to FIG. 1B.

The first interfacial region IF1 may be spaced apart from the dielectric film 260 with the second interfacial region IF2 therebetween. The second interfacial region IF2 may be in contact with the dielectric film 260.

Detailed descriptions of the first interfacial region IF1 and the second interfacial region IF2 may be the same as those provided above with reference to FIG. 2.

In the IC device 200 described with reference to FIGS. 4 to 7, the interfacial lower electrode layer 254 of the lower electrode LE2, which is in contact with the dielectric film 260, may have a co-doping structure including the first metal dopant D1 and the second metal dopant D2 having different valences. The first metal dopant D1 and the second metal dopant D2, which are in the interfacial lower electrode layer 254, may provide different functions, and thus, the interfacial lower electrode layer 254 may serve as a multifunctional layer.

More specifically, from among the first metal dopant D1 and the second metal dopant D2 of the interfacial lower electrode layer 254, the first metal dopant D1 having a relatively greater concentration (than the second metal dopant D2) may have a valence state of +5. Thus, the first metal dopant D1 may prevent a depletion region from occurring in the lower electrode LE2, and a leakage current may be reduced in the capacitor CP2. In addition, the first metal dopant D1 may have a valence state of +5 and the second metal dopant D2 may have a valence state of +3 and, thus, spontaneous polarization may occur in the dielectric film 260 due to the interfacial lower electrode layer 254. Accordingly, the dielectric film 260 may ensure a high field tunability, the capacitor CP2 may obtain a desired capacitance, and the reliability of the IC device 200 may be improved.

Figure 8A:
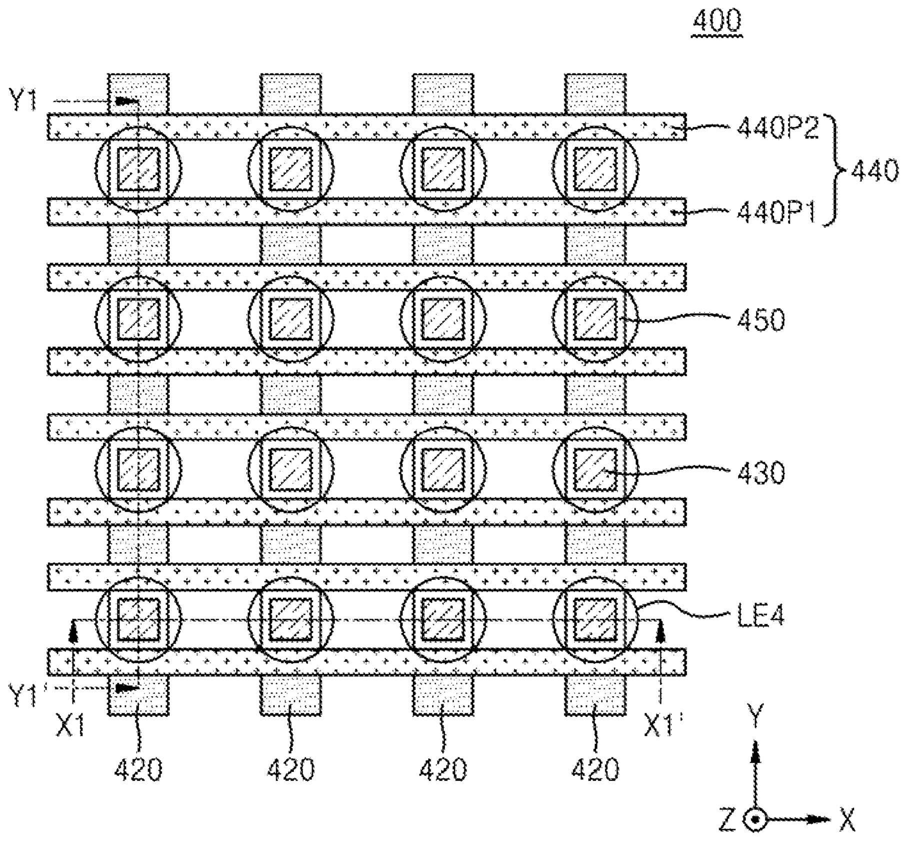
FIG. 8A illustrates a layout of an IC device according to an example embodiment.
Figure 8B:
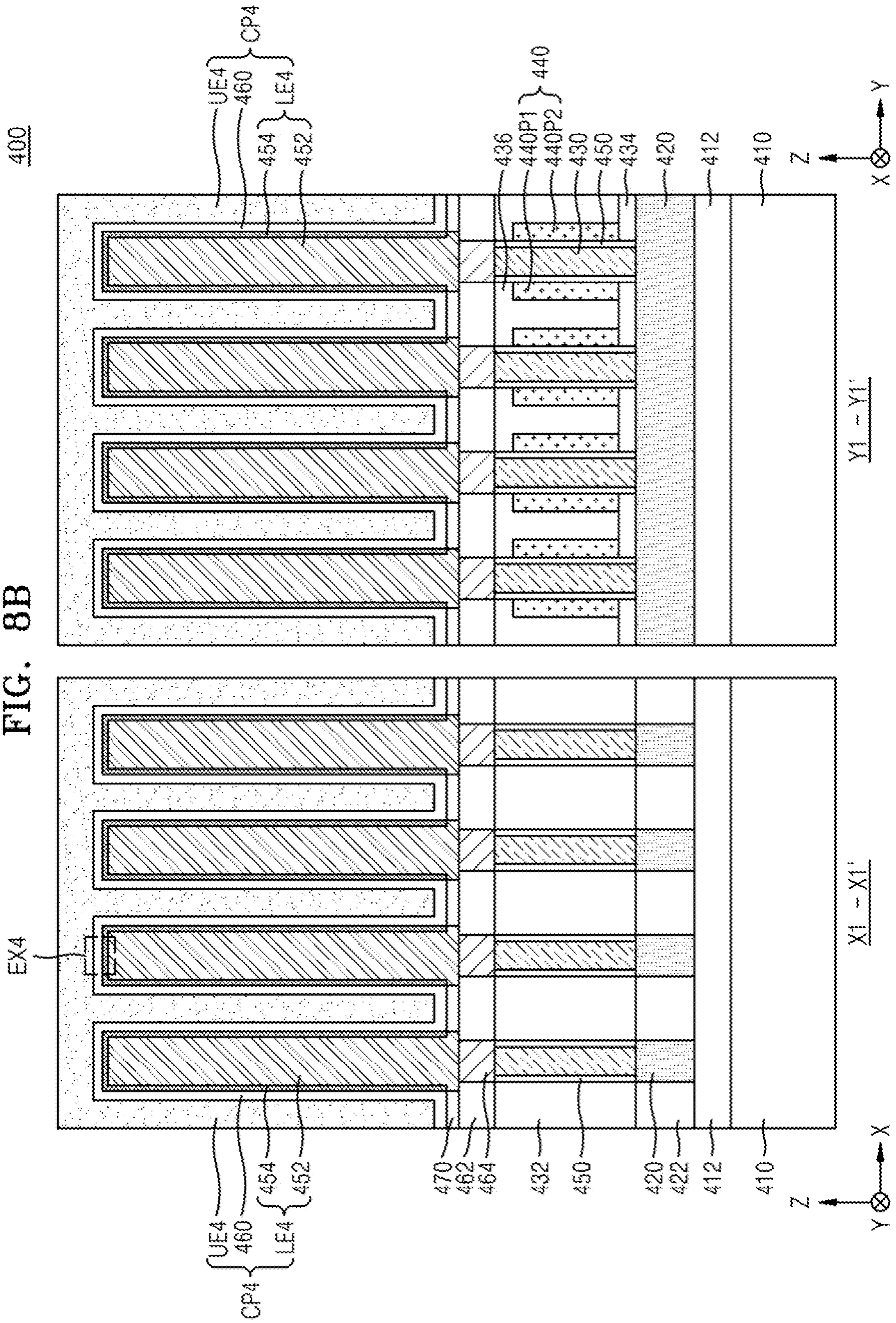
FIG. 8B is a cross-sectional view taken along lines X1-X1' and Y1-Y1' of FIG. 8A.

FIG. 8A illustrates a layout of an IC device 400 according to an example embodiment, and FIG. 8B is a cross-sectional view taken along lines X1-X1' and Y1-Y1' of FIG. 8A.

Referring to FIGS. 8A and 8B, the IC device 400 may include a substrate 410, a plurality of first conductive lines 420, a channel layer 430, a gate electrode 440, a gate insulating layer 450, and a capacitor CP4.

The IC device 400 may include a memory device including a vertical channel transistor (VCT). The VCT may refer to a structure in which a channel length of the channel layer 430 extends from the substrate 410 in a vertical direction (Z direction).

A lower insulating layer 412 may be on the substrate 410.

The plurality of first conductive lines 420 may be spaced apart from each other on the lower insulating layer 412 in a first lateral direction (X direction), and may extend long in a second lateral direction (Y direction).

A plurality of first insulating patterns 422 may be on the lower insulating layer 412 to fill respective spaces between the plurality of first conductive lines 420. The plurality of first insulating patterns 422 may extend long in the second lateral direction (Y direction), and top surfaces of the plurality of first insulating patterns 422 may be at the same level as top surfaces of the plurality of first conductive lines 420.

The plurality of first conductive lines 420 may function as bit lines of the IC device 400.

The plurality of first conductive lines 420 may include doped polysilicon, a metal, a conductive metal nitride, a conductive metal silicide, a conductive metal oxide, or a combination thereof. For example, the plurality of first conductive lines 420 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof.

The plurality of first conductive lines 420 may include a single layer or a multilayered structure of the materials described above.

The plurality of first conductive lines 420 may include a two-dimensional (2D) semiconductor material. For example, the 2D semiconductor material may include graphene, carbon nanotubes, or a combination thereof.

The channel layers 430 may be arranged in a matrix form on the plurality of first conductive lines 420 and spaced apart from each other in the first lateral direction (X direction) and the second lateral direction (Y direction). The channel layer 430 may have a first width in the first lateral direction (X direction) and a first height in the vertical direction (Z direction), and the first height may be greater than the first width. For example, the first height may be about twice to about 10 times as great as the first width. A bottom portion of the channel layer 430 may serve as a first source/drain region (not shown), an upper portion of the channel layer 430 may serve as a second source/drain region (not shown), and a portion of the channel layer 430 between the first and second source/drain regions may serve as a channel region (not shown).

The channel layer 430 may include an oxide semiconductor. The oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. Values of "x," "y," and "z" may be integers or may be non-integers, x, y, $z>0$, $0<x<0.9$, $0<y<0.9$, and $0<z<0.9$.

The channel layer 430 may include a single layer or a multilayered structure of the oxide semiconductor.

In example embodiments, the channel layer 430 may have a bandgap energy greater than that of silicon. For example, the channel layer 430 may have a bandgap energy of about 1.5 eV to about 5.6 eV. For example, the channel layer 430 may have a bandgap energy of about 2.0 eV to about 4.0 eV.

The channel layer 430 may be polysilicon or amorphous silicon. The channel layer 430 may include a 2D semiconductor material. For example, the 2D semiconductor material may include graphene, carbon nanotubes, or a combination thereof.

The gate electrode 440 may be on both sidewalls of the channel layer 430 in the first lateral direction (X direction). The gate electrode 440 may include a first sub-gate electrode 440P1 facing a first sidewall of the channel layer 430 and a second sub-gate electrode 440P2 facing a second sidewall opposite to the first sidewall of the channel layer 430, such that one channel layer 430 is between the first sub-gate electrode 440P1 and the second sub-gate electrode 440P2, and the IC device 400 has a dual-gate transistor structure. The second sub-gate electrode 440P2 may be omitted, and a single-gate transistor structure including only the first sub-gate electrode 440P1, which faces the first sidewall of the channel layer 430, may be implemented.

The gate electrode 440 may include doped polysilicon, a metal, a conductive metal nitride, a conductive metal silicide, a conductive metal oxide, or a combination thereof. For example, the gate electrode 440 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof.

The gate insulating layer 450 may surround the sidewall of the channel layer 430 and may be between the channel layer 430 and the gate electrode 440. The entire sidewall of the channel layer 430 may be surrounded by the gate insulating layer 450, and a portion of a sidewall of the gate electrode 440 may be in contact with the gate insulating layer 450. The gate insulating layer 450 may cover only partial regions of the sidewalls of the channel layer 430, which face the gate electrode 440.

The gate insulating layer 450 may include a silicon oxide film, a silicon oxynitride film, a high-k dielectric film having a greater dielectric constant than the silicon oxide film, or a combination thereof. The high-k dielectric film may include a metal oxide or a metal oxynitride. For example, a high-k dielectric film, which may be used as the gate insulating layer 450, may include $HfO_2$, HfSiO, HfSiON, HfTaO, HfTiO, HfZrO, $ZrO_2$, $Al_2O_3$, or a combination thereof.

A plurality of second insulating patterns 432 may extend in the second lateral direction (Y direction) on the plurality of first insulating patterns 422. The channel layer 430 may be between two adjacent ones of the plurality of second insulating patterns 432.

Between two adjacent second insulating patterns 432, a first buried layer 434 and a second buried layer 436 may be in a space between two adjacent channel layers 430. The first buried layer 434 may be at a bottom portion of a space between two adjacent channel layers 430, and the second buried layer 436 may be formed on the first buried layer 434 to fill the remaining portion of the space between the two adjacent channel layers 430. A top surface of the second buried layer 436 may be at the same level as a top surface of the channel layer 430, and the second buried layer 436 may cover a top surface of the gate electrode 440. In another case, the plurality of second insulating patterns 432 may include a material layer continuous with the plurality of first insulating patterns 422. Alternatively, the second buried layer 436 may include a material continuous with the first buried layer 434.

A capacitor contact 464 may be on the channel layer 430. The capacitor contact 464 may overlap the channel layers 430 in the vertical direction (Z direction) and may be arranged in a matrix form and spaced apart from another capacitor contact 464 in the first lateral direction (X direction) and the second lateral direction (Y direction).

The capacitor contact 464 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof.

An upper insulating layer 462 may be on the plurality of second insulating patterns 432 and the second buried layer 436, and may surround sidewalls of the capacitor contact 464.

An etch stop film 470 may be on the upper insulating layer 462. The capacitor CP4 may be on the etch stop film 470.

The capacitor CP4 may include a lower electrode LE4, a dielectric film 460, and an upper electrode UE4.

The lower electrode LE4 may include a main lower electrode layer 452 spaced apart from the dielectric layer 460, and may include an interfacial lower electrode layer 454 in contact with the dielectric film 460.

The lower electrode LE4 may include a metal-containing film including a first metal.

The main lower electrode layer 452 may not include a metal dopant of a different type from that of the first metal.

The interfacial lower electrode layer 454 may include two types of metal dopants including different metal elements from that of the first metal.

Constituent materials of the main lower electrode layer 452 and the interfacial lower electrode layer 454, which are in the lower electrode LE4, the dielectric film 460, and the upper electrode UE4, may be respectively substantially the same as those of the main lower electrode layer 152 and the interfacial lower electrode layer 154, which are in the lower electrode LE1, the dielectric film 160, and the upper electrode UE1, which have been described with reference to FIGS. 1A and 1B.

In FIG. 8B, region "EX4" may have substantially the same configuration as described with reference to FIG. 6 or FIG. 7. In example embodiments, as in the interfacial lower electrode layer 254 described with reference to FIG. 6, the interfacial lower electrode layer 454 of the lower electrode LE4 may include or be present as a single layer, in which the first metal dopant D1 and the second metal dopant D2 are non-uniformly mixed. The interfacial lower electrode layer 454 may further include oxygen atoms D3 as in the interfacial lower electrode layer 254 shown in FIG. 6. In other example embodiments, as the interfacial lower electrode layer 254 described with reference to FIG. 7, the interfacial lower electrode layer 454 of the lower electrode LE4 may include a double layer including a first interfacial region IF1, in which the first metal dopant D1 is at a greater concentration than the second metal dopant D2, and a second interfacial region IF2, in which the second metal dopant D2 is at a greater concentration than the first metal dopant D1. In the interfacial lower electrode layer 454, a first concentration of the first metal dopant D1 may be greater than a second concentration of the second metal dopant D2, e.g., in the interfacial lower electrode layer 454, the first concentration of the first metal dopant D1 may be in a range of more than 0 at % and equal to or less than about 10 at %, and the second concentration of the second metal dopant D2 may be lower than the first concentration and in a range of more than 0 at % and equal to or less than about 5 at %. The interfacial lower electrode layer 454 may further include oxygen atoms D3 as in the interfacial lower electrode layer 254 shown in FIG. 7.

The lower electrode LE4 may be in contact with a top surface of the capacitor contact 464 by passing through the etch stop film 470, and be electrically connectable to the capacitor contact 464. The lower electrode LE4 may have a pillar shape extending in the vertical direction (Z direction). The lower electrode LE4 may overlap the capacitor contact 464 in the vertical direction (Z direction), and a plurality of lower electrodes LE4 may be arranged in a matrix form and apart from each other in the first lateral direction (X direction) and the second lateral direction (Y direction). In another case, landing pads (not shown) may be further provided between the capacitor contact 464 and the lower electrode LE4, and the plurality of lower electrodes LE4 may be arranged in a hexagonal form.

FIGS. 9A to 9F are cross-sectional views of a process sequence of a method of manufacturing an IC device according to an example embodiment.

In FIGS. 9A to 9F, the same reference numerals are used to denote the same elements as in FIGS. 4 to 7, and repeated descriptions thereof will be omitted.

Figure 9A:
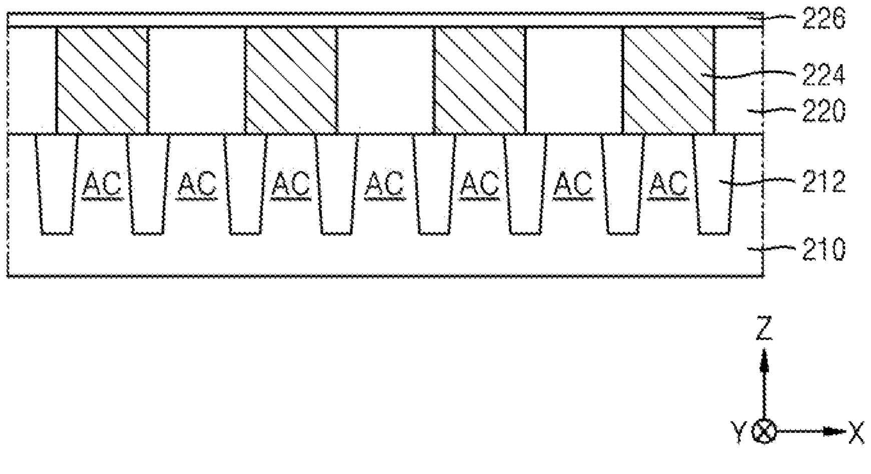
FIGS. 9A to 9F are cross-sectional views of a process sequence of a method of manufacturing an IC device, according to an example embodiment.

Referring to FIG. 9A, a lower structure 220 and a conductive region 224 may be formed on a substrate 210, in which an active region AC is defined by the device isolation film 212. The conductive region 224 may pass through the lower structure 220 and be connected to the active region AC.

Thereafter, an insulating film 226 may be formed to cover the lower structure 220 and the conductive region 224.

The insulating film 226 may be used as an etch stop layer in a subsequent process.

The insulating film 226 may include an insulating material having an etch selectivity with respect to the lower structure 220. In some embodiments, the insulating film 226 may include a silicon nitride (SiN) film, a silicon carbonitride (SiCN) film, a silicon boron nitride (SiBN) film, or a combination thereof.

Figure 9B:
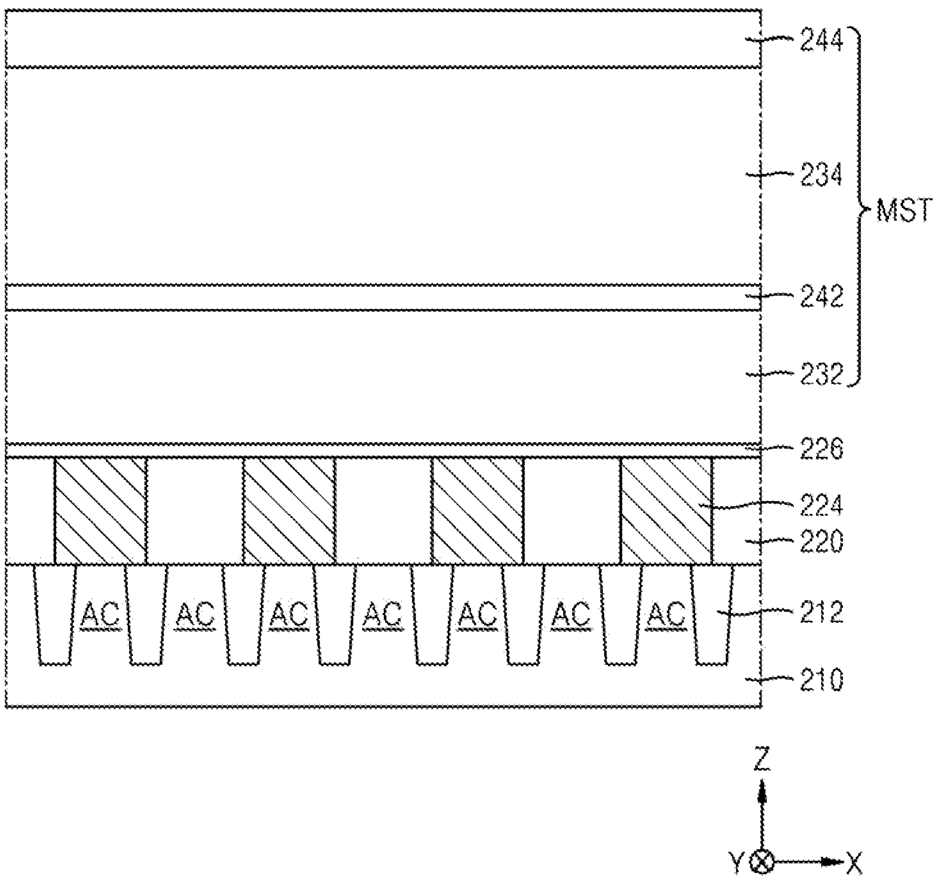

Referring to FIG. 9B, a mold structure MST may be formed on the insulating film 226.

The mold structure MST may include a plurality of mold layers and a plurality of support films. For example, the mold structure MST may include a first mold film 232, a lower insulating support film 242, a second mold film 234, and an upper insulating support film 244, which are sequentially stacked on the insulating film 226.

Each of the first mold film 232 and the second mold film 234 may include a material, which has a relatively high etch rate with respect to an etchant including ammonium fluoride ($NH_4F$), hydrofluoric acid (HF), and water, and may be removed by a lift-off process using the etchant. In some embodiments, each of the first mold film 232 and the second mold film 234 may include an oxide film, a nitride film, or a combination thereof.

The first mold film 232 may include a boro phospho silicate glass (BPSG) film. The BPSG film may include at least one of a first portion, in which the concentration of a dopant B (boron) varies in a thickness direction of the BPSG film, and a second portion, in which the concentration of a dopant P (phosphorus) varies in the thickness direction of the BPSG film.

The second mold film 234 may include a silicon nitride film or a multilayered insulating film, in which a silicon oxide film and a silicon nitride film, each of which has a relatively small thickness, are alternately and repeatedly stacked one by one plural times.

The lower insulating support film 242 may include the same material as the upper insulating support film 244. Each of the lower insulating support film 242 and the upper insulating support film 244 may include a silicon nitride (SiN) film, a silicon carbonitride (SiCN) film, a silicon boron nitride (SiBN) film, or a combination thereof. For example, each of the lower insulating support film 242 and the upper insulating support film 244 may include the silicon carbonitride (SiCN) film.

The lower insulating support film 242 may include a different material from the upper insulating support film 244. For example, the lower insulating support film 242 may include the silicon carbonitride (SiCN) film, and the upper insulating support film 244 may include a boron (B)-containing silicon nitride film.

Figure 9C:
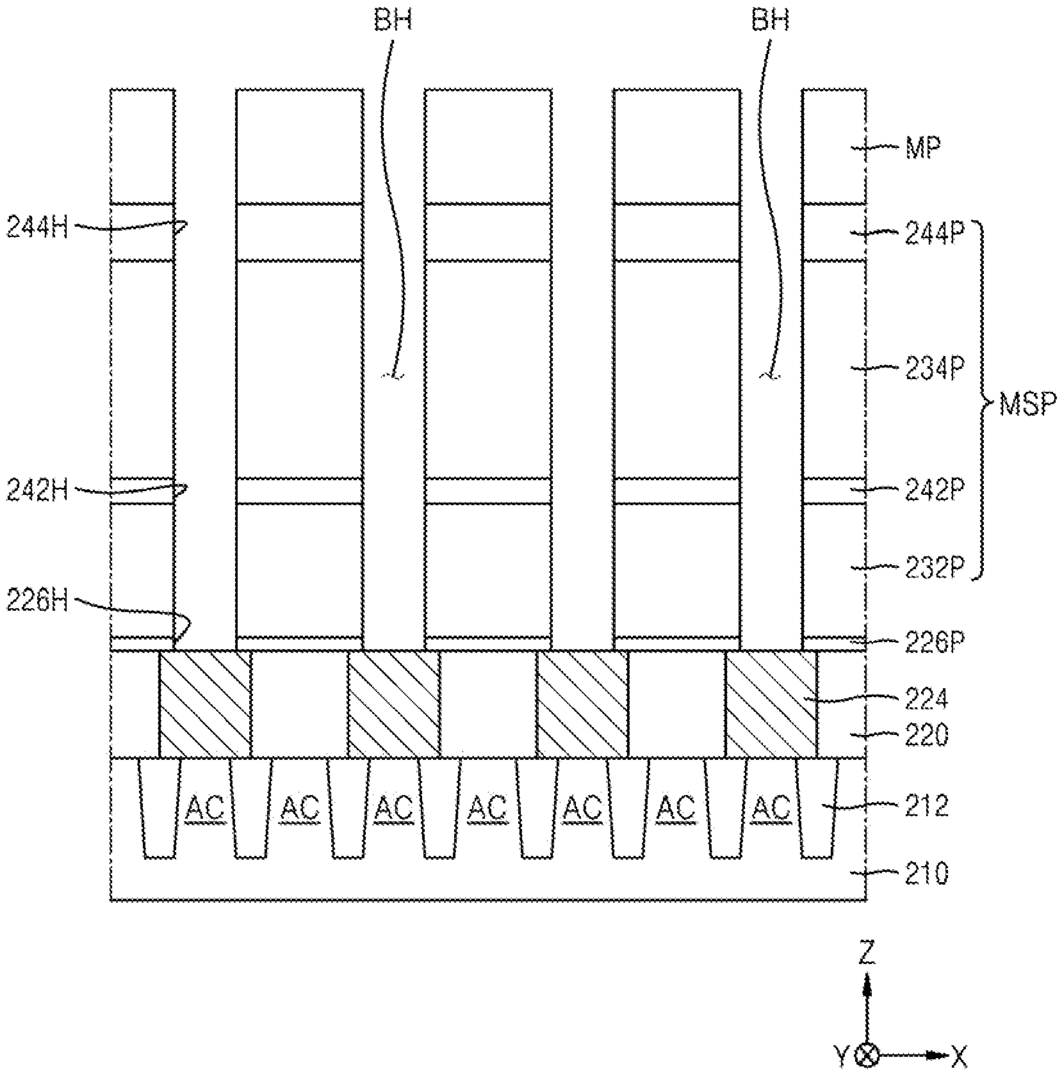

Referring to FIG. 9C, a mask pattern MP may be formed on the mold structure MST in the resultant structure of FIG. 9B.

Thereafter, the mold structure MST may be anisotropically etched using the mask pattern MP as an etch mask and using the insulating film 226 as an etch stop layer, to thus form a mold structure pattern MSP defining a plurality of holes BH.

The mold structure pattern MSP may include a first mold pattern 232P, a lower insulating support pattern 242P, a second mold pattern 234P, and an upper insulating support pattern 244P.

The mask pattern MP may include a nitride film, an oxide film, a polysilicon film, a photoresist film, or a combination thereof.

The process of forming the plurality of holes BH may further include wet etching the resultant structure obtained by anisotropically etching the mold structure MST. During the process of wet processing the resultant structure obtained by anisotropically etching the mold structure MST, portions of the insulating film 226 may be etched together, and thus, an insulating pattern 226P having a plurality of openings 226H exposing the plurality of conductive regions 224 may be obtained. An example process for wet processing the resultant structure obtained by anisotropically etching the mold structure MST may be performed using an etchant including a diluted sulfuric acid peroxide (DSP) solution.

In the mold structure pattern MSP, a plurality of holes 242H, which are portions of the plurality of holes BH, may be formed in the lower insulating support pattern 242P, and a plurality of holes 244H, which are also portions of the plurality of holes BH, may be formed in the upper insulating support pattern 244P.

Figure 9D:
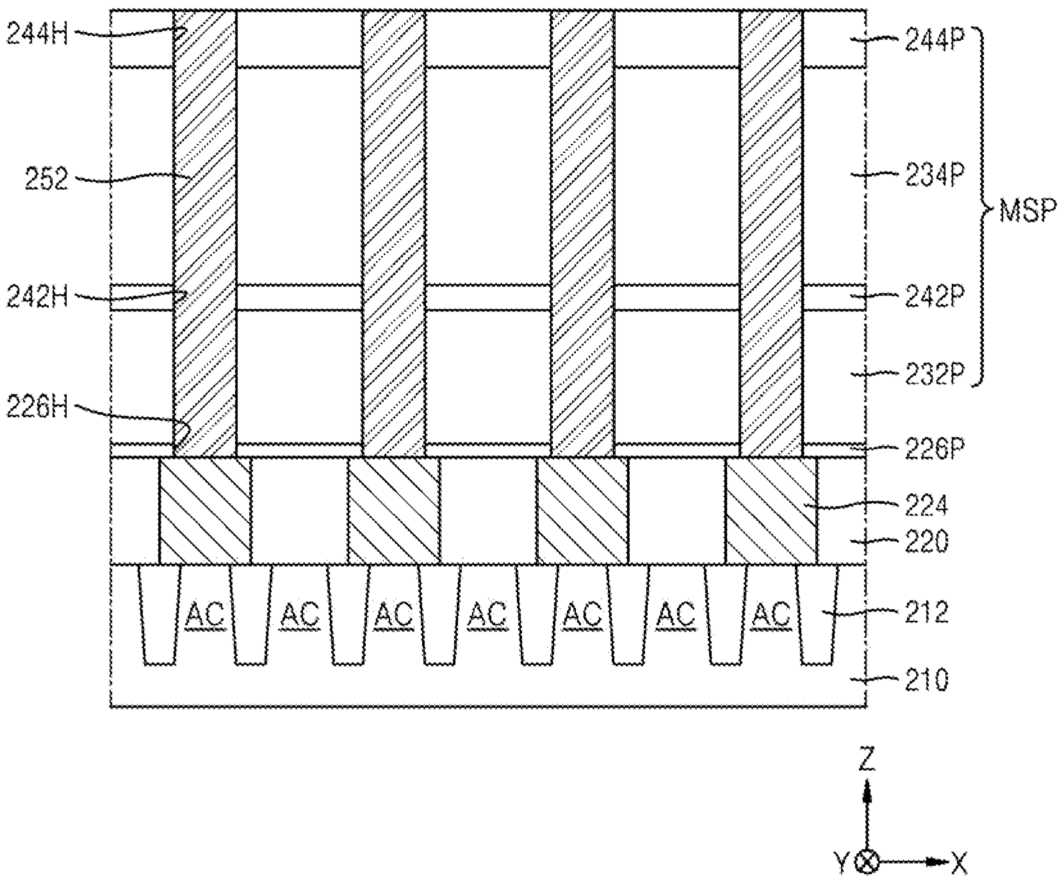

Referring to FIG. 9D, the mask pattern MP may be removed from the resultant structure of FIG. 9C, and a main lower electrode layer 252 may be formed to fill the plurality of holes BH.

In example embodiments, to form the main lower electrode layer 252, a conductive layer may be formed on the resultant structure of FIG. 9D to fill the plurality of holes BH and cover a top surface of the upper insulating support pattern 244P. To form the conductive layer, a chemical vapor deposition (CVD) process, a plasma-enhanced CVD (PECVD) process, a metal organic CVD (MOCVD) process, or an atomic layer deposition (ALD) process may be used. Afterwards, a portion of the conductive layer may be removed using an etchback process or a chemical mechanical polishing (CMP) process, and thus, the top surface of the upper insulating support pattern 244P may be exposed. In an implementation, the material used to form the conductive layer may include, e.g., TiN.

Figure 9E:
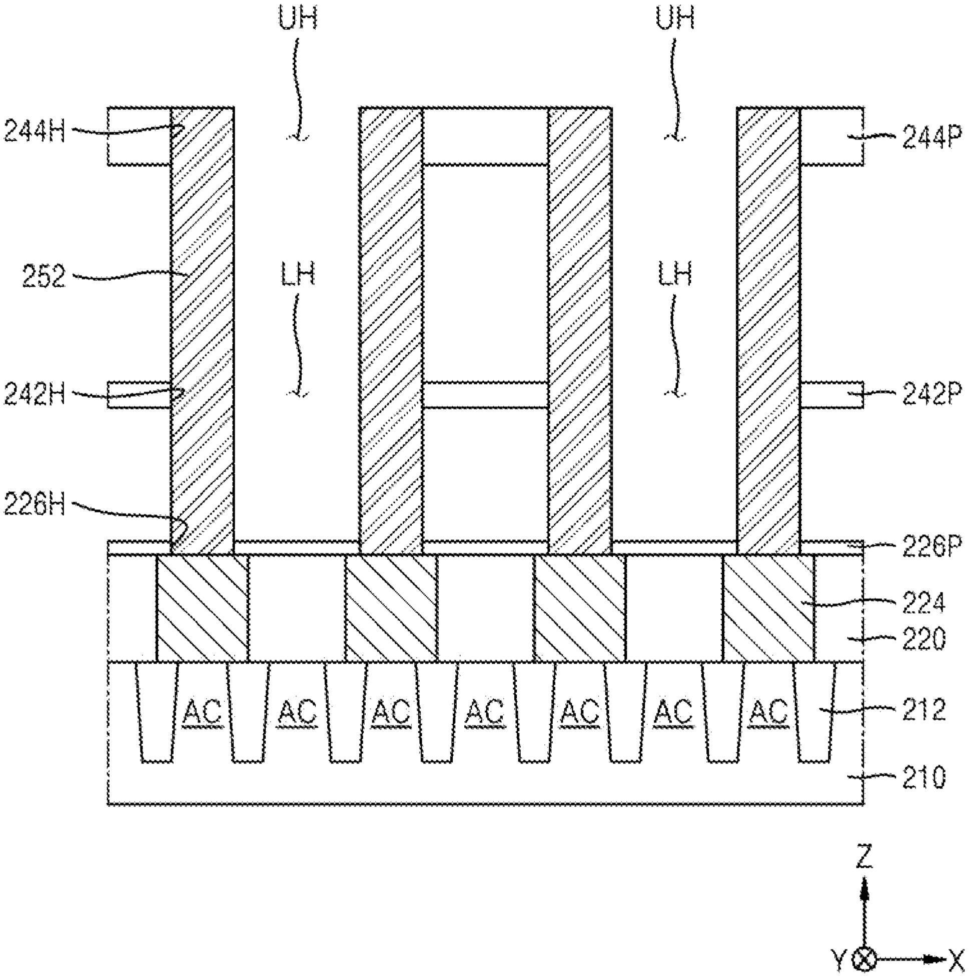

Referring to FIG. 9E, a plurality of upper holes UH may be formed by removing portions of the upper insulating support pattern 244P from the resultant structure of FIG. 9D.

Thereafter, the second mold pattern 234P may be wet removed through the plurality of upper holes UH.

Next, portions of the lower insulating support pattern 242P, which are exposed through the plurality of upper holes UH, may be removed to form a plurality of lower holes LH.

Thereafter, the first mold pattern 232P may be wet removed through the plurality of lower holes LH to expose a top surface of the insulating pattern 226P.

After the first mold pattern 232P and the second mold pattern 234P are removed, sidewalls of a plurality of main lower electrode layers 252 may be exposed.

The second mold pattern 234P and the first mold pattern 232P may be wet removed using an etchant including ammonium fluoride ($NH_4F$), hydrofluoric acid (HF), and water, without being limited thereto.

Figure 9F:
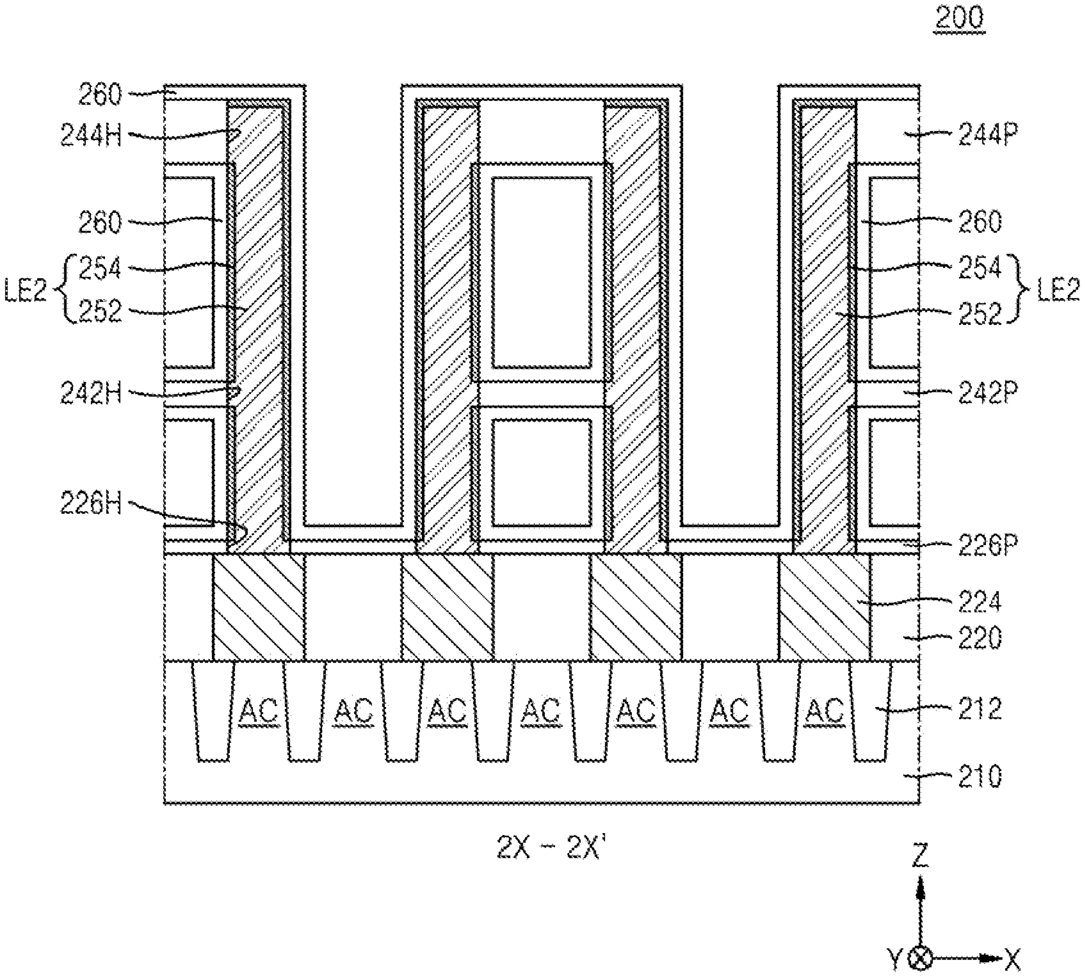

Referring to FIG. 9F, and as described in further detail below, the first metal dopant D1 and the second metal dopant D2 may be diffused into a partial region of each of the plurality of main lower electrode layers 252 from exposed surfaces of the plurality of main lower electrode layers 252 (i.e., from among the exposed surfaces of the structure in FIG. 9E). Thus, a plurality of interfacial lower electrode layers 254 may be formed at various locations of the plurality of main lower electrode layers 252. The plurality of main lower electrode layers 252 and the plurality of interfacial lower electrode layers 254 may constitute a plurality of lower electrodes LE2.

A dielectric film 260 may be formed to cover exposed surfaces of the plurality of interfacial lower electrode layers 254, respective exposed surfaces of the lower insulating support pattern 242P and the upper insulating support pattern 244P, and exposed surfaces of the insulating pattern 226P.

To form the plurality of interfacial lower electrode layers 254 at various locations of the plurality of main lower electrode layers 252, a first metal oxide film and a second metal oxide film (not shown) may be sequentially formed using an ALD process to cover exposed surfaces of the structure in FIG. 9E.

The first metal oxide film may include an oxide thin film including the first metal dopant D1. The first metal oxide film may include a $V_2O_5$ film, a $Ta_2O_5$ film, a $Nb_2O_5$ film, or a $Mo_2O_5$ film.

The second metal oxide film may include an oxide thin film including the second metal dopant D2. The second metal oxide film may include an $Al_2O_3$ film, a $La_2O_3$ film, a $Y_2O_3$ film, a $V_2O_3$ film, a $Cr_2O_3$ film, a $Nb_2O_3$ film, or a $Ta_2O_3$ film.

To form the first metal oxide film and the second metal oxide film, a selective deposition process may be performed, such that the first metal oxide film and the second metal oxide film may be selectively formed only on respective exposed surfaces of the plurality of main lower electrode layers 252, from among the exposed surfaces of the resultant structure of FIG. 9E. To this end, before the first metal oxide film and the second metal oxide film are formed, a deposition inhibition process may be performed to selectively inhibit deposition on surfaces on which the formation of the first metal oxide film and the second metal oxide film is not desired, e.g., a surface of each of the insulating pattern 226P, the lower insulating support pattern 242P, and the upper insulating support pattern 244P, from among the exposed surfaces of the structure in FIG. 9E.

For example, when the insulating pattern 226P, the lower insulating support pattern 242P, and the upper insulating support pattern 244P include a silicon nitride-based material, a deposition inhibition process using $O_2$ as a pre-processing gas may be performed on the surface of each of the insulating pattern 226P, the lower insulating support pattern 242P, and the upper insulating support pattern 244P. Thus, an exposed surface of each of the insulating pattern 226P, the lower insulating support pattern 242P, and the upper insulating support pattern 244P may be maintained in a stabilized state by being terminated with a *—Si—O—Si—* bonding structure.

Thereafter, an annealing process may be performed in a state in which a surface of each of the plurality of main lower electrode layers 252 is covered by the first metal oxide film and the second metal oxide film. The annealing process may diffuse the first metal dopant D1 and the second metal dopant D2 from the first metal oxide film and the second metal oxide film, respectively, into each of the plurality of main lower electrode layers 252.

The annealing process may be performed at a temperature of about 200° C. to about 700° C.

Additionally, during the annealing process, oxygen atoms D3 derived from the first metal oxide film and the second metal oxide film may also diffuse into each of the plurality of main lower electrode layers 252.

By controlling a thickness of each of the first metal oxide film and the second metal oxide film, a temperature during the annealing process, and an annealing time, the plurality of interfacial lower electrode layers 254 may have a structure described with reference to FIG. 6 or a structure described with reference to FIG. 7.

The process of forming the dielectric film 260 may be performed after the plurality of interfacial lower electrode layers 254 are formed.

Alternatively, in the formation of the dielectric film 260, the dielectric film 260 may be formed to cover the second metal oxide film (after the first metal oxide film and the second metal oxide film are formed to form the plurality of interfacial lower electrode layers 254), and before the annealing process is performed (to diffuse the first metal dopant D1 and the second metal dopant D2 into each of the plurality of main lower electrode layers 252 from the first metal oxide film and the second metal oxide film). That is, the annealing process may be performed after the dielectric film 260 is formed. Due to the annealing process, the first metal dopant D1 and the second metal dopant D2 may be diffused from the first metal oxide film and the second metal oxide film, respectively, into each of the plurality of main lower electrode layers 252 and simultaneously, the crystallinity of the dielectric film 260 may be improved.

Afterwards, the upper electrode UE2 may be formed on the resultant structure of FIG. 9F, and thus, the IC device 200 shown in FIGS. 4 to 7 may be manufactured. In example embodiments, to form the upper electrode UE2, a CVD process, an MOCVD process, a physical vapor deposition (PVD) process, or an ALD process may be used.

Although the method of manufacturing the IC device 200 shown in FIGS. 4 to 7, according to the example embodiment, has been described with reference to FIGS. 9A to 9F, it will be understood that the IC device 100A shown in FIGS. 1A and 1B, the IC device 100B shown in FIG. 2, the IC device 100C shown in FIGS. 3A and 3B, the IC device 400 shown in FIGS. 8A and 8B, and IC devices having variously modified structures may be manufactured by making various modifications and changes with reference to the descriptions of FIGS. 9A to 9F.

By way of summation and review, it is desired to develop IC devices having structures capable of reducing leakage currents in capacitors with reduced sizes and maintaining desired electrical properties.

Example embodiments may provide an integrated circuit (IC) device having a structure capable of reducing a leakage current in a capacitor and ensuring a desired capacitance. Example embodiments may provide an IC device including a capacitor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
a lower electrode on a substrate;
a dielectric film covering the lower electrode; and
an upper electrode facing the lower electrode with the dielectric film therebetween, wherein:
the lower electrode includes:
an interfacial lower electrode layer in contact with the dielectric film; and
a metal-containing film including a first metal as a main lower electrode layer, the main lower electrode layer being spaced apart from the dielectric film,
the interfacial lower electrode layer includes:
the first metal;
a first metal dopant; and
a second metal dopant,
the first metal dopant includes a second metal that is in a first valence state,
the second metal dopant includes a third metal that is in a second valence state, the second valence state being less than the first valence state,
the second metal is different from the first metal,
the third metal is different from the first metal and the second metal, and
the main lower electrode layer does not include a metal dopant of a metal that is different from the first metal.

2. The integrated circuit device as claimed in claim 1, wherein, in the interfacial lower electrode layer:
the second metal is in a valence state of +5, and
the third metal is in a valence state of +3.

3. The integrated circuit device as claimed in claim 1, wherein, in the interfacial lower electrode layer:
the first metal dopant is present in a first concentration,
the second metal dopant is present in a second concentration, and
the first concentration is greater than the second concentration.

4. The integrated circuit device as claimed in claim 1, wherein the interfacial lower electrode layer is a single layer, in which the first metal dopant and the second metal dopant are non-uniformly mixed.

5. The integrated circuit device as claimed in claim 1, wherein:
the interfacial lower electrode layer includes:
a first interfacial region, in which the first metal dopant is present at a greater concentration than the second metal dopant, and
a second interfacial region, in which the second metal dopant is present at a greater concentration than the first metal dopant,
the first interfacial region is spaced apart from the dielectric film with the second interfacial region therebetween, and
the second interfacial region is in contact with the dielectric film.

6. The integrated circuit device as claimed in claim 1, wherein the dielectric film includes at least one of a ferroelectric material film, an anti-ferroelectric material film, or a paraelectric material film.

7. The integrated circuit device as claimed in claim 1, wherein the dielectric film includes a multilayered film, in which a plurality of material films including different materials are stacked, and an inner dielectric film of the multilayered film, which is in contact with the interfacial lower electrode layer, includes a ferroelectric material film or an anti-ferroelectric material film.

8. The integrated circuit device as claimed in claim 1, wherein:
each of the lower electrode and the upper electrode includes a metal nitride film including the first metal, and
the interfacial lower electrode layer includes the first metal dopant, the second metal dopant, and oxygen atoms, which are doped into the metal nitride film.

9. The integrated circuit device as claimed in claim 1, wherein the dielectric film includes:
a first dielectric film including a ferroelectric material film, an anti-ferroelectric material film, or a combination thereof;
a second dielectric film including a paraelectric material film; and
an inserted dielectric film, which is disposed between the first dielectric film and the second dielectric film, and the inserted dielectric film has a bandgap energy that is greater than a bandgap energy of each of the first dielectric film and the second dielectric film.

10. An integrated circuit device, comprising:

a substrate including an active region;

a conductive region on the active region;

a capacitor on the conductive region; and an insulating support pattern configured to support a portion of the capacitor, wherein:

the capacitor includes:

a lower electrode, a portion of the lower electrode being in contact with the insulating support pattern;

a dielectric film, the dielectric film covering the lower electrode and the insulating support pattern; and an upper electrode, the upper electrode facing the lower electrode with the dielectric film being between the upper electrode and the lower electrode, the lower electrode includes:

an interfacial lower electrode layer in contact with the dielectric film; and a metal-containing film including a first metal as a main lower electrode layer, the main lower electrode layer being spaced apart from the dielectric film, the interfacial lower electrode layer includes:

the first metal;

a first metal dopant; and a second metal dopant, the first metal dopant includes a second metal that is in a first valence state, the second metal dopant includes a third metal that is in a second valence state, the second valence state being less than the first valence state, the second metal is different from the first metal, the third metal is different from the first metal and the second metal, and the main lower electrode layer does not include a metal dopant of a metal that is different from the first metal.

11. The integrated circuit device as claimed in claim 10, wherein:

the first metal is selected from titanium (Ti), niobium (Nb), cobalt (Co), and tin (Sn), the second metal is selected from vanadium (V), tantalum (Ta), niobium (Nb), and molybdenum (Mo), and the third metal is selected from aluminum (Al), lanthanum (La), yttrium (Y), vanadium (V), chromium (Cr), niobium (Nb), and tantalum (Ta), provided that the second metal is different from the first metal, and the third metal is different from the first metal and the second metal.

12. The integrated circuit device as claimed in claim 10, wherein, in the interfacial lower electrode layer:

a first concentration of the first metal dopant is in a range of more than 0 atomic percent (at %) and equal to or less than about 10 at %, and a second concentration of the second metal dopant is lower than the first concentration and in a range of more than 0 at % and equal to or less than 5 at %.

13. The integrated circuit device as claimed in claim 10, wherein the interfacial lower electrode layer is a single layer, in which the first metal dopant and the second metal dopant are non-uniformly mixed.

14. The integrated circuit device as claimed in claim 10, wherein:

the interfacial lower electrode layer includes:

a first interfacial region, in which the first metal dopant is at a greater concentration than the second metal dopant; and a second interfacial region, in which the second metal dopant is at a greater concentration than the first metal dopant, the first interfacial region is spaced apart from the dielectric film with the second interfacial region therebetween, and the second interfacial region is in contact with the dielectric film.

15. An integrated circuit device, comprising:

a substrate including an active region;

a plurality of conductive regions on the active region;

a plurality of lower electrodes respectively connected to the plurality of conductive regions;

an insulating support pattern in contact with a partial region of each of the plurality of lower electrodes to support the plurality of lower electrodes;

a dielectric film covering the plurality of lower electrodes and the insulating support pattern; and an upper electrode facing the plurality of lower electrodes with the dielectric film between the upper electrode and the plurality of lower electrodes, wherein:

each of the plurality of lower electrodes includes:

an interfacial lower electrode layer in contact with the dielectric film; and a metal-containing film including a first metal as a main lower electrode layer, the main lower electrode layer being spaced apart from the dielectric film, the interfacial lower electrode layer includes:

the first metal;

a first metal dopant; and a second metal dopant, the first metal dopant includes a second metal that is in a first valence state, the second metal dopant includes a third metal that is in a second valence state, the second valence state being less than the first valence state, the second metal is different from the first metal, the third metal is different from the first metal and the second metal, and in the interfacial lower electrode layer, a first dopant concentration of the first metal dopant is greater than a second dopant concentration of the second metal dopant, and the main lower electrode layer does not include a metal dopant of a metal that is different from the first metal.

16. The integrated circuit device as claimed in claim 15, wherein, in the interfacial lower electrode layer:

the second metal is in a valence state of +5, and the third metal is in a valence state of +3.

17. The integrated circuit device as claimed in claim 15, wherein:

the interfacial lower electrode layer includes:

a first interfacial region, in which the first metal dopant is present at a greater concentration than the second metal dopant; and a second interfacial region, in which the second metal dopant is present at a greater concentration than the first metal dopant, the first interfacial region is spaced apart from the dielectric film, with the second interfacial region between the first interfacial region and the dielectric film, and the second interfacial region is in contact with the dielectric film.

18. The integrated circuit device as claimed in claim 15, wherein each of the plurality of lower electrodes and the upper electrode includes a titanium nitride (TiN) film, the second metal is selected from vanadium (V), tantalum (Ta), niobium (Nb), and molybdenum (Mo), and the third metal is selected from aluminum (Al), lanthanum (La), yttrium (Y), vanadium (V), chromium (Cr), niobium (Nb), and tantalum (Ta), provided that the third metal is different from the second metal.

19. The integrated circuit device as claimed in claim 15, wherein, in the interfacial lower electrode layer:

a first concentration of the first metal dopant is in a range of more than 0 at % and equal to or less than 10 at %, and a second concentration of the second metal dopant is lower than the first concentration and in a range of more than 0 at % and equal to or less than 5 at %.

20. The integrated circuit device as claimed in claim 1, wherein:

the interfacial lower electrode layer includes:

a first interfacial region, in which the first metal dopant is present at a different concentration than the second metal dopant, and a second interfacial region, between the first interfacial region and the dielectric film, in which the second metal dopant is present at a different concentration than the first metal dopant.

* * * * *